(12) United States Patent
Takahashi et al.

(10) Patent No.: US 10,991,736 B2
(45) Date of Patent: Apr. 27, 2021

(54) METHOD OF PRODUCING SOLID-STATE IMAGING DEVICE HAVING COLOR FILTERS, SOLID-STATE IMAGING DEVICE HAVING COLOR FILTERS, METHOD OF PRODUCING COLOR FILTER DEVICE COMPRISING COLOR FILTERS, AND COLOR FILTER DEVICE COMPRISING COLOR FILTERS

(71) Applicant: TOPPAN PRINTING CO., LTD., Taito-ku (JP)

(72) Inventors: Satoshi Takahashi, Taito-ku (JP); Tomohiro Imoto, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 0 days.

(21) Appl. No.: 15/977,115

(22) Filed: May 11, 2018

(65) Prior Publication Data
US 2018/0261639 A1    Sep. 13, 2018

Related U.S. Application Data

(63) Continuation of application No. PCT/JP2016/083861, filed on Nov. 15, 2016.

(30) Foreign Application Priority Data

Nov. 16, 2015  (JP) .............................. JP2015-224016
Jun. 10, 2016  (JP) .............................. JP2016-116498

(51) Int. Cl.
*H01L 27/146*      (2006.01)
*H01L 21/3065*     (2006.01)
(Continued)

(52) U.S. Cl.
CPC .. *H01L 27/14621* (2013.01); *H01L 27/14623* (2013.01); *H01L 27/14629* (2013.01);
(Continued)

(58) Field of Classification Search
CPC combination set(s) only.
See application file for complete search history.

(56) References Cited

U.S. PATENT DOCUMENTS 7,914,957 B2   3/2011   Yoshibayashi
7,932,122 B2   4/2011   Ogata et al.
(Continued)

FOREIGN PATENT DOCUMENTS

JP   4-248502 A    9/1992
JP   11-68076 A    3/1999
(Continued)

OTHER PUBLICATIONS

International Search Report dated Feb. 7, 2017 in PCT/JP2016/083861, filed Nov. 15, 2016, 5 pages.

*Primary Examiner* — Suberr L Chi
(74) *Attorney, Agent, or Firm* — Oblon, McClelland, Maier & Neustadt, L.L.P.

(57) ABSTRACT

A method of producing a color filter includes applying, on a semiconductor substrate, a first color filter material including a first resin dispersion including a first pigment and a resin material, curing the first color filter material such that a first color filter film is formed and serves as a precursor of a first color filter including the first pigment, forming a photosensitive resin mask material layer on the first color filter film, forming openings by photolithography in portions of the photosensitive resin mask material layer such that second and subsequent color filters including pigments of colors different from the first pigment are to be formed in the openings, and that portions of the first color filter film are
(Continued)

exposed by the openings, dry-etching the portions of the first color filter film by using a dry etching gas and the photosensitive resin mask material layer as an etching mask, removing the etching mask such that the first color filter is formed, and forming the second and subsequent color filters.

12 Claims, 11 Drawing Sheets

(51) Int. Cl.
 *G02B 5/20* (2006.01)
 *H01L 21/311* (2006.01)
(52) U.S. Cl.
 CPC .......... *H01L 27/14685* (2013.01); *G02B 5/20* (2013.01); *H01L 21/3065* (2013.01); *H01L 21/31138* (2013.01); *H01L 21/31144* (2013.01)

(56) References Cited

U.S. PATENT DOCUMENTS

| 8,097,485 | B2 | 1/2012 | Ogata et al. |
| 2008/0053953 | A1 | 3/2008 | Yoshibayashi |
| 2016/0326348 | A1 | 11/2016 | Aoyagi |

FOREIGN PATENT DOCUMENTS

| JP | 2006-163316 A | 6/2006 |
| JP | 2008-77038 A | 4/2008 |
| JP | 2009-103746 A | 5/2009 |
| JP | 4857569 B | 1/2012 |
| JP | 4905760 B | 3/2012 |
| JP | 5046639 B | 10/2012 |
| JP | 2015-166445 A | 9/2015 |

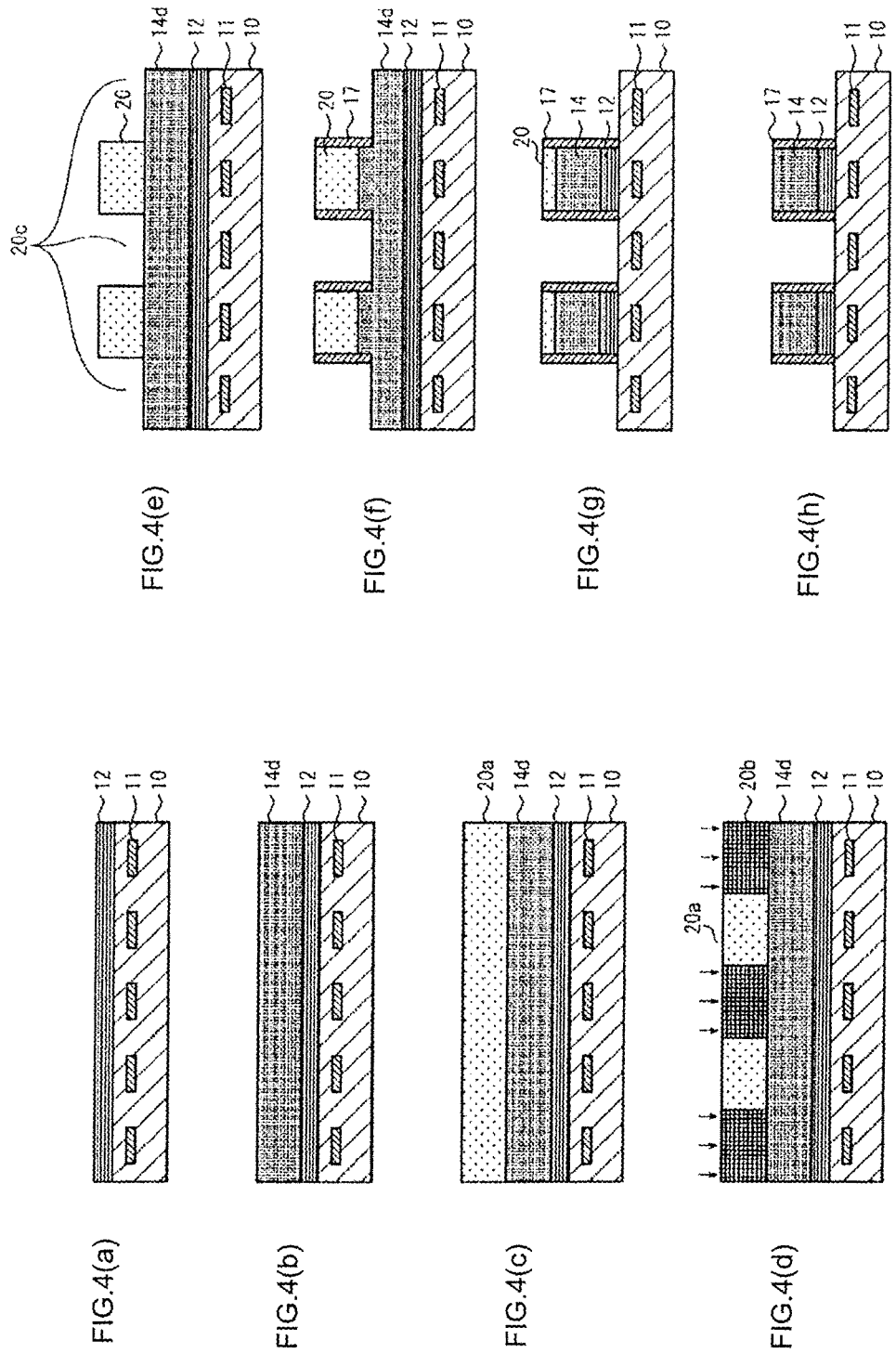

METHOD OF PRODUCING SOLID-STATE IMAGING DEVICE HAVING COLOR FILTERS, SOLID-STATE IMAGING DEVICE HAVING COLOR FILTERS, METHOD OF PRODUCING COLOR FILTER DEVICE COMPRISING COLOR FILTERS, AND COLOR FILTER DEVICE COMPRISING COLOR FILTERS

CROSS-REFERENCE TO RELATED APPLICATIONS

The present application is a continuation of International Application No. PCT/JP2016/083861, filed Nov. 15, 2016, which is based upon and claims the benefits of priority to Japanese Application No. 2015-224016, filed Nov. 16, 2015, and Japanese Application No. 2016-116498, filed Jun. 10, 2016. The entire contents of all of the above applications are incorporated herein by reference.

BACKGROUND OF THE INVENTION

Field of the Invention

The present invention relates to a method of producing a solid-state imaging device typified by a photoelectric conversion element, such as CCD and CMOS, the solid-state imaging device, a method of producing a color filter used therefor, and the color filter.

Discussion of the Background

Solid-state imaging devices, such as CCDs (charge coupled devices) and CMOSs (complementary metal oxide semiconductors) mounted to digital cameras or the like, have recently made progress in high pixel density and miniaturization, and particularly minute ones have a pixel size smaller than 1.4 μm×1.4 μm.

Such a solid-state imaging device is designed to produce colors using color filters provided above the photoelectric conversion elements. Such a solid-state imaging device has regions (openings) in which the photoelectric conversion elements of the solid-state imaging device contribute to photoelectric conversion. The regions (openings) depend on the size and the number of pixels of the solid-state imaging device. The area of the openings is limited to about 20 to 50% of the total area of the solid-state imaging device. Small openings directly lead to sensitivity reduction of the photoelectric conversion elements, and therefore the solid-state imaging device is generally provided with light-collecting microlenses over the photoelectric conversion elements to compensate for sensitivity reduction.

Recently, there have been developed image sensors using a backside-illumination technology with which the area of the openings of the photoelectric conversion elements is increased to 50% or more of the total area of the solid-state imaging device. However, in this case, light leaking from a color filter may enter the photoelectric conversion elements from between adjacent color filters. Therefore, it is necessary to form each microlens with an appropriate size and shape.

As a method of forming color filter patterns over a solid-state imaging device, photolithography is usually used as disclosed in Patent Literature (PTL) 1.

As another formation method, PTL 2 discloses a method of patterning a color filter layer of first color by dry-etching and patterning color filter layers of second and subsequent colors through photolithography to form color filter patterns on the solid-state imaging device.

Further, PTLs 3 and 4 disclose methods for forming color filter patterns of all of colors by dry etching.

Recently, high-definition CCD imaging devices having more than 8,000,000 pixels are increasingly sought, entailing an increasing need of imaging devices with color filter patterns conforming to a pixel size of less than 1.4 μm×1.4 μm. However, the smaller pixel size leads to insufficient resolution of color filter patterns formed by photolithography, thereby creating a problem of adversely affecting characteristics of the solid-state imaging device. For example, for a solid-state imaging device of 1.4-μm square or less, or about 1.1-μm or 0.9-μm square, the insufficient resolution may cause hue variation which is due to a defective shape of the patterns.

As the pixel size of the color filter patterns decreases, the aspect ratio increases. That is, each color filter pattern will have a thickness that is large relative to the width thereof. In such color filter patterns, portions that should be removed (ineffective portions of pixels) remain as residues without being completely removed and adversely affect pixels of other colors. When developing time is extended as a measure for removing the residues, for example, there occurs another problem of peeling off cured pixels which are actually needed.

In addition, when satisfactory spectral characteristics are attempted to be obtained, the thickness of the color filter layer may unavoidably increase. However, when the color filter layer has a larger thickness and pixel miniaturization advances more, corners of the color filter patterns are rounded, for example, and the resolution tends to degrade even more. When the thickness of the color filter pattern layer is made smaller, while attempting to obtain the spectral characteristics, the pigment concentration needs to be increased in the color filter pattern material. However, when the pigment concentration is increased, light that is necessary for photocuring reaction does not reach the bottom of the color filter pattern layer, and the curing of the color filter layer will be insufficient. This creates a problem of peeling off of the color filter layer when developed in lithography, and causing a pixel defect.

In the case where the pigment concentration in the color filter material is increased to decrease the thickness of the color filter layer and obtain the required spectral characteristics, the photopolymerization curing components are relatively reduced. Accordingly, photocuring of the color filter layer will be insufficient, easily causing shape change, uneven in-plane shape, shape collapse, and the like. Further, when exposure at the time of curing is increased to sufficiently photocure the color filter layer, productivity may be reduced.

Due to highly defined color filter patterns, the thickness of the color filter patterns not only is associated with problems raised in the manufacturing process, but also adversely affects the characteristics as the solid-state imaging device. If the thickness of the color filter patterns is large, light that is incident from the oblique direction of a pixel may be dispersed by the color filter of a specific color and then enter an adjacent color filter pattern part and the photoelectric conversion element. In this case, color mixing may occur. Color mixing may become more prominent, as the pixel size of the color filter patterns is made smaller and the aspect ratio of the pixel size and the film thickness becomes larger. Color mixing due to incident light is also prominent if the distance from the color filter patterns to the photoelectric conversion elements increases due to provision of a material of a planarizing layer or the like on the substrate where the photoelectric conversion elements are formed. Thus, it is important to reduce the thickness such as of the color filter patterns or the planarizing layer formed under these patterns.

In a known method of preventing color mixing due to entry of light from a direction oblique to pixels, barriers are formed between the color filters of respective colors to block light. Color filters for optical display devices, such as liquid crystal displays, use generally known barriers of a black matrix structure (BM) made of a black material. In this regard, solid-state imaging devices include color filter patterns each having a size of several micrometers or less. Therefore, if barriers are formed by a generally used method of forming the black matrix, pixels are partially filled with BM, causing pixel defects and resolution lowering, because pattern size is large.

In the case of solid-state imaging devices of advanced high definition, the barriers need to have a size of several hundred nanometers, more preferably, a width of about 200 nm or less. This means that high definition of pixels has advanced to an extent of a pixel size of about 1 µm. Therefore, a color filter layer, if it exerts the light-blocking effect of reducing or preventing color mixing, is desired to have a thickness of 100 nm or less. It is difficult to form barriers of this size through photolithography using MB. Another barrier forming method that can be considered may, for example, be to form barriers by forming a film of an inorganic material, such as metal or $SiO_2$, by dry etching, vapor deposition, sputtering or the like, and by cutting the upper portion of a grating pattern by etching, or the like. However, such a method entails very high manufacturing cost due to complication of the manufacturing apparatus, the manufacturing process, or the like.

As will be understood from the above, highly defined color filter patterns are needed for increasing the number of pixels of solid-state imaging devices, while thinning of color filter patterns and prevention of color mixing in the patterns are important issues.

As described above, advancement of high definition necessitates thickness reduction of color filter patterns which are formed through photolithography by imparting photosensitivity to color filter pattern materials of conventional art. Thickness reduction of color filter patterns entails increase in the content ratio of pigment components and accordingly entails decrease in the content ratio of photosensitive components. Therefore, resolution will be poor, residues will easily remain, and pixel peeling will easily occur, which may lead to deteriorating the characteristics of the solid-state imaging devices.

Therefore, the technology as disclosed in PTLs 2 and 3 has been proposed to achieve high definition in color filter patterns and thickness reduction of the color filters. In the methods disclosed in PTLs 2 and 3, a color filter is formed by dry etching, which can be used in the absence of photosensitive components (photopolymerization curing components), so that pigment concentration is improved in the color filter materials. Such a technique of using dry etching can produce a color filter with improved pigment concentration, which achieves sufficient spectral characteristics even when the film thickness is reduced.

PTL 1 JP H11-68076 A
PTL 2 JP 4857569 B
PTL 3 JP 4905760 B
PTL 4 JP 5046639 B

SUMMARY OF THE INVENTION

According to an aspect of the present invention, a method of producing a solid-state imaging device includes applying, on a semiconductor substrate, a first color filter material including a first resin dispersion including a first pigment and a resin material, curing the first color filter material such that a first color filter film is formed and serves as a precursor of a first color filter including the first pigment, forming a photosensitive resin mask material layer on the first color filter film, forming openings by photolithography in portions of the photosensitive resin mask material layer such that second and subsequent color filters including pigments of colors different from the first pigment are to be formed in the openings, and that portions of the first color filter film are exposed by the openings, dry-etching the portions of the first color filter film by using a dry etching gas and the photosensitive resin mask material layer as an etching mask, removing the etching mask such that the first color filter is formed, forming the second and subsequent color filters, and forming microlenses on the first, second and subsequent color filters such that incident light is collected to photoelectric conversion elements that are two-dimensionally arrayed in the semiconductor substrate. The dry-etching is conducted such that the dry-etching produces a reaction product of the first color filter material with the dry etching gas, and that the reaction product forms a barrier between adjacent color filters.

According to another aspect of the present invention, a solid-state imaging device includes a semiconductor substrate having two-dimensionally arrayed photoelectric conversion elements, microlenses which are positioned on the semiconductor substrate and collect incident light to the photoelectric conversion elements, color filters of multiple colors formed between the semiconductor substrate and the microlenses and positioned in correspondence with the photoelectric conversion elements, and a barrier positioned between adjacent color filters of different colors. The color filters include a first color filter including a first color material, and the barrier is formed on at least one sidewall of the first color filter and includes a first wall portion including a reaction product of the first color filter material with a dry etching gas.

According to still another aspect of the present invention, a method of producing a color filter includes applying, on a semiconductor substrate, a first color filter material including a first resin dispersion including a first pigment and a resin material, curing the first color filter material such that a first color filter film is formed and serves as a precursor of a first color filter including the first pigment, forming a photosensitive resin mask material layer on the first color filter film, forming openings by photolithography in portions of the photosensitive resin mask material layer such that second and subsequent color filters including pigments of colors different from the first pigment are to be formed in the openings, and that portions of the first color filter film are exposed by the openings, dry-etching the portions of the first color filter film by using a dry etching gas and the photosensitive resin mask material layer as an etching mask, removing the etching mask such that the first color filter is formed, and forming the second and subsequent color filters.

According to yet another aspect of the present invention, a color filter includes color filters planarly formed and having colors different from each other, the color filters including a first color filter which includes a first color filter material and has a largest area among the color filters, and a barrier formed on at least one sidewall of the first color filter and including a reaction product of the first color filter material with a dry etching gas.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 4(a)-4(h) are a set of cross-sectional diagrams sequentially illustrating a process of forming openings for forming first color filter patterns and second and subsequent color filter patterns, according to the first embodiment of the present invention.

DESCRIPTION OF THE EMBODIMENTS

Figure 1:
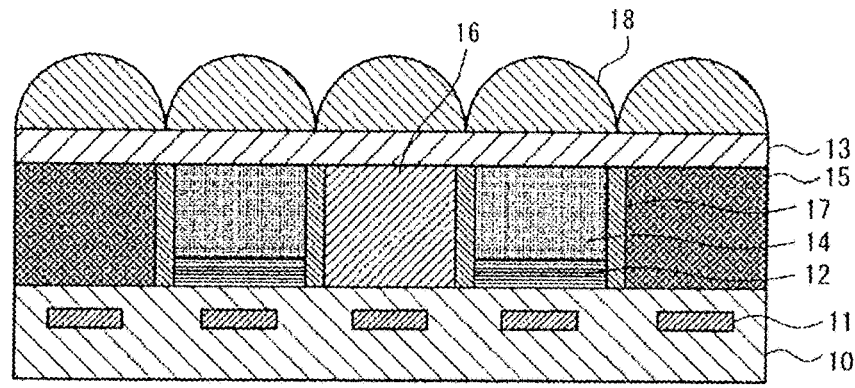
FIG. 1 is a schematic cross-sectional diagram illustrating a configuration example of a solid-state imaging device, according to a first embodiment of the present invention.

The embodiments will now be described with reference to the accompanying drawings, wherein like reference numerals designate corresponding or identical elements throughout the various drawings.

With reference to the drawings, several embodiments according to the present invention will be described.

1. First Embodiment (1-1) Configuration of Sold-State Imaging Device

As shown in FIG. 1, a sold-state imaging device according to a first embodiment of the present invention includes a semiconductor substrate 10 having a plurality of two-dimensionally arranged photoelectric conversion elements 11, a plurality of microlenses 18 arranged above the semiconductor substrate 10, color filters 14, 15 and 16 of respective colors provided between the semiconductor substrate 10 and the microlenses 18, and barriers 17 provided between the color filters 14, 15 and 16 of respective colors. The sold-state imaging device according to the first embodiment also includes a planarizing underlayer 12 formed partially on the surface of the semiconductor substrate 10, and a planarizing overlayer 13 provided on the top surfaces of the color filters 14, 15 and 16. In the sold-state imaging device according to the first embodiment, the barriers 17 provided on the sidewall of the first color filter 14, which is one of the color filters 14, 15 and 16 of respective colors, contain a reaction product of a first color filter material contained in the first color filter 14 and the dry etching gas.

In the following description of the sold-state imaging device according to the first embodiment, the color filter 14, which is formed first in the process for the production and has the largest area, is defined as a first color filter. Further, the color filter 15 formed secondly in the process of the production is defined as a second color filter, and the color filter 16 formed thirdly in the process of the production is defined as a third color filter.

It is preferred that the color filter 14 having the largest area is defined as the first color filter; however, the first color filter may be configured as a separate color filter.

Each component of the sold-state imaging device will be described below in detail.

(Photoelectric Conversion Element and Semiconductor Substrate)

The photoelectric conversion element 11 converts light into an electric signal.

The semiconductor substrate 10, in which the photoelectric conversion elements 11 are formed, generally has an outermost surface formed with a protective film for the purpose of protecting and planarizing the surface. The semiconductor substrate 10 is made of a material capable of transmitting visible light and enduring a temperature process of at least about 300° C. Examples of such a material include Si-containing materials, including an oxide, such as Si or $SiO_2$, a nitride, such as SiN, a mixture thereof, or the like. In the semiconductor substrate 10, the surface protective film is formed with a thickness in the range of about 1 nm or more to 1 μm or less, for example.

(Microlenses)

The microlenses 18 are arranged above the semiconductor substrate 10, so as to be provided for the respective photoelectric conversion elements 11 that are two-dimensionally arranged in the semiconductor substrate 10. Each of the microlenses 18 can compensate for sensitivity reduction of the corresponding one of the photoelectric conversion elements 11 by collecting light incident on the microlens 18 to the photoelectric conversion element 11.

(Planarizing Underlayer)

The planarizing underlayer 12 is provided for protecting and planarizing the surface of the semiconductor substrate 10. That is, the planarizing underlayer 12 reduces the unevenness of the top surface of the semiconductor substrate 10 due to fabrication of the photoelectric conversion elements 11 and improves adhesion of the color filter material for forming the color filters 14, 15 and 16. In the present embodiment, the material configuring the planarizing underlayer 12 serves as a source of supplying a barrier forming material. That is, during dry etching, the planarizing underlayer 12 can supply a material that reacts with the dry etching gas to produce a reaction product for forming the barriers.

The planarizing underlayer 12 need not always be provided if a protective layer has been formed on the outermost surface of the semiconductor substrate 10 in the preparation thereof and the surface has been flattened.

When the outermost surface of the semiconductor substrate 10 has been formed of a Si-containing composition mentioned above, the planarizing underlayer 12 is formed of one or more resins. Examples of the resins include an acrylic resin, an epoxy resin, a polyimide resin, a phenol novolac resin, a polyester resin, a urethane resin, a melamine resin, a urea resin, a styrene resin, and the like. Without being limited to these resins, any material can be used for the planarizing underlayer 12 if the material transmits visible light having a wavelength in the range of 400 nm to 700 nm and does not hinder the pattern formation and adhesion of the color filters 14, 15 and 16.

The planarizing underlayer 12 is preferably formed of a resin not affecting the spectral characteristics of the color filters 14, 15 and 16. For example, the planarizing underlayer 12 is preferably formed so as to have a transmittance of 90% or more with respect to visible light having a wavelength of 400 nm to 700 nm.

However, provision of the planarizing underlayer 12 increases the distance from the microlenses 18 to the semiconductor substrate 10, that is, the light entering the photoelectric conversion elements 11 will have a large optical path length. Therefore, it is preferred that the planarizing underlayer 12 is omitted.

(Planarizing Overlayer)

The planarizing overlayer 13 is provided for planarizing the top surfaces of the color filters 14, 15 and 16 and the barriers 17.

The planarizing overlayer 13 is formed of one or more resins. Examples of the resins include an acrylic resin, an epoxy resin, a polyimide resin, a phenol novolac resin, a polyester resin, a urethane resin, a melamine resin, a urea resin, a styrene resin, and the like. The planarizing overlayer 13 need not always be provided if the top surfaces of the color filters 14, 15 and 16 and the barriers 17 are flat.

(Color Filters)

The color filters 14, 15 and 16 respectively correspond to the separated colors of incident light. The color filters 14, 15 and 16 are provided between the semiconductor substrate 10 and the microlenses 18, and arranged according to a preset rule so as to respectively face the plurality of photoelectric conversion elements 11.

Figure 2:
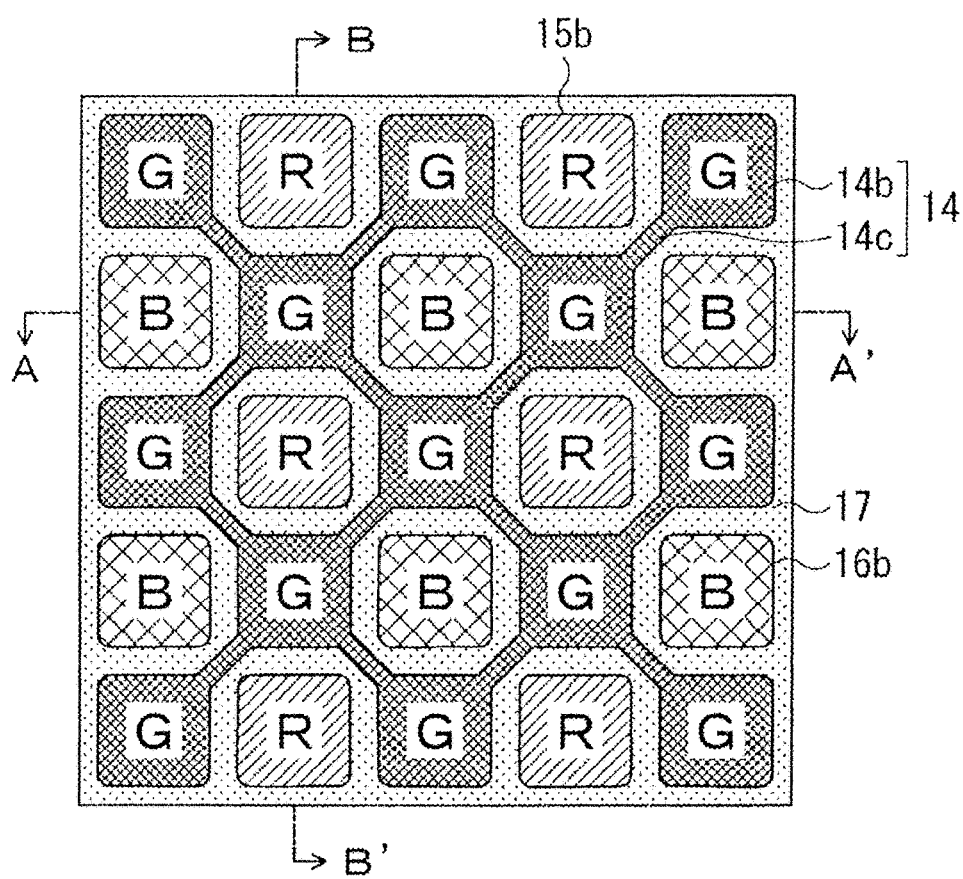
FIG. 2 is a schematic plan view illustrating a Bayer array of color filter patterns, according to the first embodiment of the present invention.

FIG. 2 is a plan view illustrating the color filters 14, 15 and 16 of respective colors and an array of the barriers 17 formed between the color filters 14, 15 and 16. The array shown in FIG. 2 is a so-called Bayer array, and is formed by laying patterns of square color filters 14, 15 and 16 (first, second and third color filter patterns 14b, 15b and 16b) each having four rounded corners.

In the present embodiment, a G (green) filter as the first color filter pattern 14b is provided for every second pixel in row and column directions. Further, in the present embodiment, R (red) filters as the second color filter patterns 15b and B (blue) filters as the third color filter patterns 16b are provided every second row or column of the G (green) filters. Accordingly, in the solid-state imaging device of the present embodiment including the color filter patterns of the Bayer array, the resolution of G (green) is N/2, and the resolutions of R (red) and B (blue) are each N/4, where N is the total number of pixels.

Figure 3A:
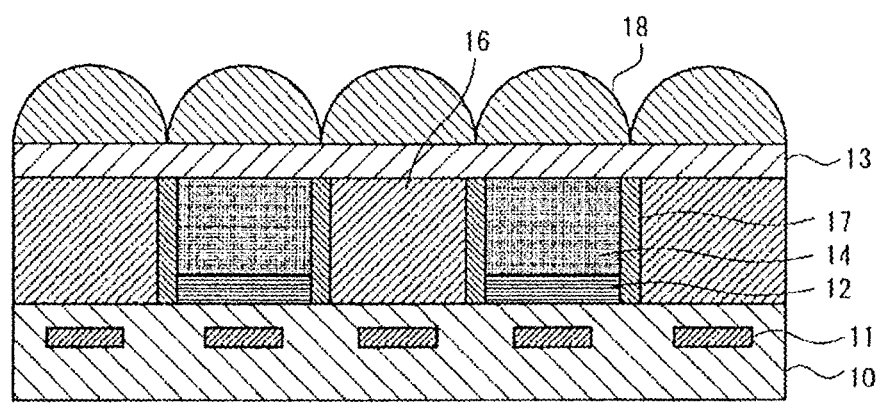
FIGS. 3(a) and 3(b) are a set of diagrams respectively illustrating an A-A' cross section and a B-B' cross section of the color filter patterns illustrated in FIG. 2, according to the first embodiment of the present invention.
Figure 3B:
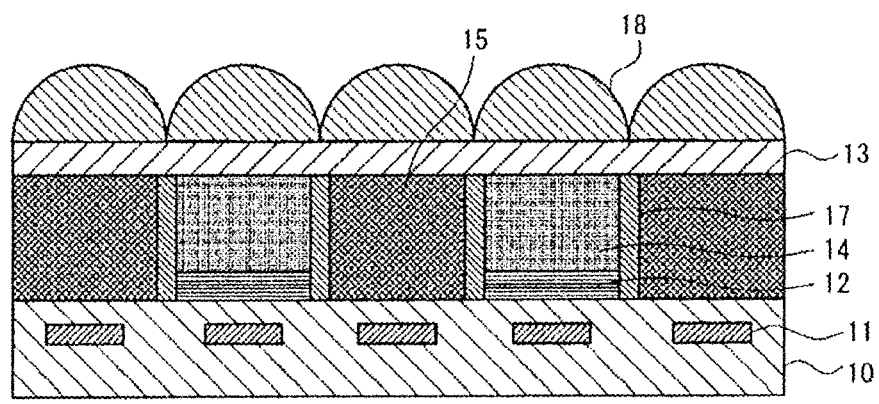

In the Bayer array, the three kinds of color filter patterns, that is, the second color filter pattern 15b (R (red) filter), the first color filter pattern 14b (G (green) filter), and the third color filter pattern 16b (B (blue) filter) are not laid side by side. As shown in FIG. 3(a), in the A-A' cross section of the solid-state imaging device of the Bayer array shown in FIG. 2, the first and third color filter patterns 14b (G (green) filter) and 16b (B (blue) filter) are alternated. Similarly, as shown in FIG. 3(b), in the B-B' cross section of the solid-state imaging device shown in FIG. 2, the first and second color filter patterns 14b (G (green) filter) and 15b (R (red) filter) are alternated. However, for simplification, the following description will be given with reference to the array shown in FIG. 1 in which the three colors (G (green) filter, R (red) filter, B (blue) filter of the first, second and third color filter patterns 14b, 15b and 16b are arrayed.

As shown in FIG. 2, the first color filter 14 among the color filters 14, 15 and 16 of respective colors is formed so as to have a larger area compared with the second and third color filters 15 and 16. The first color filter 14 occupying the largest area includes the first color filter patterns 14b and bridges 14c each connecting between the first color filter patterns 14b. In the Bayer array shown in FIG. 2, the first color filter patterns (G (green) filter) 14b are provided for every second pixel in row and column directions. Accordingly, the first color filter patterns (G (green) filter) 14b are adjacent to each other in the oblique direction in FIG. 2.

Each bridge 14c is formed so as to connect the corner portions of the respective first color filter patterns 14b adjacent to each other in the oblique direction. Thus, the second and third color filter patterns 15b and 16b are so configured to be independent from each other. The barriers 17 are formed not only at the sidewalls of each first color filter pattern 14a but also at the sidewalls of each bridge 14c. Provision of sidewalls in this way exerts an effect of reducing not only color mixing of the first color filter 14 with the second and third color filters 15 and 16, but also color mixing of the second color filter 15 with the third color filter 16.

In the present embodiment, description will be given of the solid-state imaging device having Bayer array color filters shown in FIG. 2. However, the color filters of the solid-state imaging device are not necessarily limited to ones of the Bayer array. Also, the colors of the color filters are not limited to the three RGB colors. A transparent layer with an adjusted refractive index may be arranged in part of the color filter array.

The color filters 14, 15 and 16 each contain a pigment of a predetermined color and a resin material, such as a thermosetting resin. For example, the color filter 14 contains a green pigment, the color filter 15 contains a red pigment, and the color filter 16 contains a blue pigment.

(Barriers)

The barriers 17 are provided between the color filters 14, 15 and 16 of the respective colors. In the present embodiment, the barriers 17 provided at the sidewalls of the first color filter patterns 14b and the bridges 14c can separate the first, second and third color filters 14, 15 and 16 from each other.

The barriers 17 contain the reaction product of the first color filter material contained in the first color filter 14 and the dry etching gas used for forming the first color filter 14.

(1-2) Method of Producing Solid-State Imaging Device

Referring to FIGS. 4(a) to 5(h), a method of producing a solid-state imaging device according to the first embodiment of the present invention will be described.

(Step of Forming Planarizing Underlayer)

A semiconductor substrate 10 having a plurality of two-dimensionally arranged photoelectric conversion elements 11 as shown in FIG. 4(a) is used for forming the layer. On a surface of the substrate, a planarizing underlayer 12 is formed. The planarizing underlayer 12 is formed of one or more resin materials, such as acrylic resins as mentioned above, or a compound, such as an oxidized compound or a nitride compound.

The planarizing underlayer 12 may be formed by applying the resin material mentioned above, followed by heating and curing. The planarizing underlayer 12 may be formed by depositing a film of the above-mentioned compound such as by vapor deposition, sputtering, or CVD.

The method of producing the solid-state imaging device according to the present embodiment is different from the conventional method in which a photosensitive color filter material is directly patterned by photolithography to form the color filters 14, 15 and 16. That is, with the method of producing the solid-state imaging device according to the present embodiment, a first color filter material is applied to the entire surface of the planarizing underlayer 12 and cured to form a first color filter film 14d (see FIG. 4(b)), followed by removing materials by dry etching at portions for forming other color filters. Thus, the first color filter 14 is formed first. Then, the second and subsequent color filters (second and third color filters 15 and 16) are formed at portions each of which is surrounded by the first color filter 14. In this case, using the initially formed first color filter 14 as a guide pattern, the second and subsequent color filter materials are cured through high-temperature heating. Thus, in the absence of the planarizing underlayer 12 under the second and third color filters 15 and 16, adhesion of the semiconductor substrate 10 to the color filters 14, 15 and 16 is improved. Therefore, with the method of producing the solid-state imaging device of the present embodiment, the planarizing underlayer 12 may be omitted from under the second and third color filters 15 and 16, if the protective film is formed on the surface of the semiconductor substrate 10 as a material supply source for use in preparing the barriers 17.

(Step of Forming First Color Filter Film)

The following description deals with a step of forming the first color filter film 14d that serves as a precursor of the first color filter 14 occupying the largest area in the solid-state imaging device. As shown in FIG. 3(b), the first color filter film 14d is formed on the surface of the planarizing underlayer 12 that is formed on the semiconductor substrate 10.

In the absence of the planarizing underlayer 12, the first color filter film 14d is formed on the surface of the semiconductor substrate 10. In this case, the step of forming the planarizing underlayer set forth above is omitted.

A first color filter material is applied to the surface of the semiconductor substrate 10 including a plurality of two-dimensionally arranged photoelectric conversion elements 11 therein. The first color filter material, that is a first resin dispersion liquid, contains a resin material as a main component, with a first pigment dispersed therein. As shown in FIG. 2, the solid-state imaging device of the present embodiment uses the color filters of a Bayer array. Accordingly, the first pigment is preferably green (G). When the RGB Bayer array is used, the green pigment concentration in the first color filter material tends to be insufficient when patterned by photolithography, if the first color filter material contains photosensitive components to an extent enabling formation of fine patterns. If a green color filter can be formed as the first color filter 14, the second and third color filters 15 and 16 can be formed as red and blue color filters, respectively, which are made of color filter materials containing red and blue pigments which can easily contain photosensitive components.

Examples of the resin material that can be used for the first color filter material include a thermosetting resin, a photocuring resin, such as an ultraviolet-curing resin, and a mixture thereof. Particularly, the thermosetting resin is preferably used. When the thermosetting resin is used as the resin material, the photocuring resin need not be contained, and thus the concentration of the first pigment to be added can be increased. Accordingly, the first color filter 14 can be easily formed with a small thickness and with desired spectral characteristics.

When the photocuring resin material is used as the resin material, the entire surface of the coating film only has to be cured and thus the content of the photosensitive components can be reduced, unlike in the conventional method of directly forming desired patterns on the color filter material that is permitted to have photosensitivity for exposure. Thus, the concentration of the first pigment to be added can be increased compared to the color filter material of the conventional method. Accordingly, the first color filter 14 with a reduced thickness and desired spectral characteristics can be easily formed.

When a green pigment is contained as the first pigment of the first color filter material, the resin material mentioned above with a refractive index of 1.55 to 1.7 may be used.

Then, the first color filter material applied onto the surface of the planarizing underlayer 12 is cured. A known method can be used as the curing method. For example, the first color filter material can be cured by heating if a thermosetting resin is used as the resin material of the first color filter material, or by irradiation of light, such as ultraviolet light, if a photocuring resin is used as the resin material of the first color filter material.

When producing the solid-state imaging device, high-temperature heating is performed at about 200° C. or higher and 300° C. or lower for forming the microlenses 18. For this reason, the first color filter material preferably has high temperature resistance. Accordingly, it is more preferred to use a thermosetting resin having high temperature resistance as the resin material.

The first color filter material is cured as described above to thereby form the first color filter film 14d serving as the precursor of the first color filter (see FIG. 4(b)).

(Step of Forming Etching Mask)

Then, as shown in FIGS. 4(c) to 4(e), an etching mask having openings is formed on the first color filter film 14d formed previously.

First, as shown in FIG. 4(c), a photosensitive resin mask material is applied onto the surface of the first color filter film 14d and dried to form a photosensitive resin mask layer 20a.

Then, as shown in FIG. 4(d), the photosensitive resin mask layer 20a is exposed using a photomask (not shown) to cause a chemical reaction with which the patterns other than required patterns are made soluble in a developer.

Then, as shown in FIG. 4(e), unwanted portions (exposed portions) of the photosensitive resin mask layer 20a are removed through development. As a result of the development, openings 20c are provided to portions of the photosensitive resin mask layer 20a respectively facing the formation positions of the second and third color filters 15 and 16. In this way, an etching mask 20 having openings is formed. A second color filter material or a third color filter material is filled in the openings 20c at processing performed later.

The openings 20c are each formed into a square shape with the four corners rounded as shown in FIG. 2. Thus, the first color filter 14 is formed into a shape in which the four corners of each first color filter pattern 14a in a square shape are respectively connected to those of other patterns 14a through the bridges 14c. With the first color filter 14 in such a shape, the optical characteristics of the solid-state imaging device are improved, and the second and third color filters 15 and 16 are easily formed by photolithography. When the bridges 14c are prepared by etching, etching may be performed in the lateral direction. Therefore, it is preferred to adjust the film thickness of the photosensitive resin mask layer 20a in preparation for the lateral direction etching.

Examples of the photosensitive resin mask material that can be used include an acrylic resin, an epoxy resin, a polyimide resin, a phenol novolac resin, and other resins having photosensitivity. These materials can be used singly or in combination or copolymerization of two or more. The exposure machine used for photolithography when patterning the photosensitive resin mask layer 20a may be a scanner, a stepper, an aligner, a mirror projection aligner, or the like. Exposure may be performed by direct electron beam drawing, laser drawing, or the like. Of these exposure machines and methods, the stepper or the scanner is generally used for forming the first color filter 14 of the solid-state imaging device that requires high pixel density and fine patterns.

It is preferred that a generally used photoresist is used for the photosensitive resin mask material to produce high-resolution and high-definition patterns. Use of a photoresist enables formation of patterns with easy control of shape and with high dimensional accuracy, unlike in the case of forming patterns using a color filter material imparted with photosensitivity.

As the photoresist used for the mask material, one having high dry etching resistance is preferred. When a photoresist is used as the etching mask material for dry etching, thermal curing that is referred to as post baking is performed frequently after development to improve etch selectivity that is an etch rate ratio of the mask material relative to the member to be etched. However, if the processing includes thermal curing, it may be difficult to remove the residual resist that has served as the etching mask, in removal processing following the dry etching. Therefore, the photoresist may preferably be one that can obtain good etch selectivity between the photoresist and the member to be etched even when the photoresist is not thermally cured. If good etch selectivity cannot be obtained, the photoresist material needs to be made thick, which in turn makes it difficult to form fine patterns by photolithography. Accordingly, it is preferred that the photoresist is a material having high dry etching resistance.

Specifically, the etch rate ratio (etch selectivity) between the photosensitive resin mask material as the etching mask and the first color filter material to be dry-etched is preferably in the range of about 0.5 or more to 5.0 or less, and more preferably 0.8 or more to 5.0 or less. With this etch selectivity, the photosensitive resin mask layer 20a can be configured by a photosensitive resin mask material with a thickness that can obtain good resolution. If the etch rate is increased to improve productivity, the photoresist serving as the etching mask is prevented from being depleted, for the improvement of etching controllability. More specifically, when the thickness of the first color filter material is in the range of about 0.3 μm or more to 0.8 μm or less, the photosensitive resin mask layer 20a preferably has a thickness in the range of about 0.6 μm or more to 2.0 μm or less.

The photoresist used in this case may be a positive resist or a negative resist, both of which will cause no problem. However, considering removal of the photoresist after etching, a positive resist is more preferred which more easily causes a chemical reaction dissolving the resist as the reaction proceeds, than a negative resist which causes a chemical reaction, due to external factors, for curing the photoresist as the reaction proceeds.

The etching mask is formed as described above.

(Step of Forming First Color Filter)

Then, as shown in FIGS. 4(f) to 4(h), the first color filter film 14d is dry-etched using the etching mask 20 and the dry etching gas to partially remove portions exposed from the openings 20c to thereby form the first color filter 14.

As shown in FIG. 4(f), the first color filter film 14d is dry-etched using the etching mask 20. Examples of the method of dry etching include ECR, a parallel flat plate magnetron, DRM, ICP, and two-frequency RIE (reactive ion etching). The etching method is not particularly limited, but may preferably be one that can control etching such that the etch rate and the etching shape remain unchanged even for patterns of different sizes and areas, such as large-area patterns having a width of several millimeters or more or fine patterns having a width of several hundred nanometers. Further, it is preferred to use a dry etching method with a control mechanism that is capable of performing uniform in-plane dry etching over the entire surface of a Si wafer with a size of about 100 mm to 450 mm.

The dry etching gas may be one having reactivity (oxidization and reduction), or may be one having etching properties. For example, the gas having reactivity may be a gas containing fluorine, oxygen, bromine, sulfur, chlorine or the like. The dry etching gas may be mixed with noble gases, singly or in combination, such as argon or helium, having low reactivity and containing elements that perform etching by physical impact of ions. When performing dry etching under a plasma environment using a gas, the gas is not necessarily limited to the ones mentioned above, as long as the gas causes a reaction forming desired patterns. In the initial stage of etching, materials are etched using an etching gas, in which 90% or more of the total gas flow is a noble gas that performs etching mainly by physical impact of ions, mixed with a fluorine-based gas or an oxygen-based gas. Use of such an etching gas, being coupled with the effect of chemical reaction, improves the etch rate.

In the present embodiment, the semiconductor substrate 10 is made of a material mainly containing silicon. Accordingly, the dry etching gas may preferably be one that etches the color filter material but does not etch the primer semiconductor substrate 10. When using a gas that etches the semiconductor substrate 10, multi-stage etching may be used. In the multi-stage etching, a gas that etches the semiconductor substrate 10 is used first, and then the gas is changed to one that does not etch the semiconductor substrate 10. Any type of etching gas may be used, as long as the gas can etch the color filter material nearly vertically by using the etching mask 20, without affecting the semiconductor substrate 10 and without forming residues of the color filter material.

As shown in FIG. 4(g), the first color filter film 14d is etched until reaching the surface of the semiconductor substrate 10, and then the etching mask 20 is removed to thereby form the first color filter 14 as shown in FIG. 4(h). In the present embodiment, the planarizing underlayer 12 partially remains under the first color filter 14.

(Dry Etching Conditions in the Absence of Si from Planarizing Underlayer)

In the present embodiment, if the surface of the semiconductor substrate 10 is protected and planarized by a Si-containing material, e.g., an oxide film such as of $SiO_2$, or a nitride film such as of SiN, the surface of the semiconductor substrate 10 may be etched to a depth not affecting the characteristics of the photoelectric conversion elements. The depth not affecting the characteristics of the photoelectric conversion elements refers to, for example, the range of about 0 nm or more to 30 nm or less.

If the planarizing underlayer 12 does not contain Si, a Si-containing film protecting and planarizing the semiconductor substrate 10 may be etched to form a reaction product that contains Si, for use as the barriers 17. If the planarizing underlayer 12 contains Si, it is preferred not to etch the semiconductor substrate 10 as much as possible, because there is a risk of affecting the photoelectric conversion elements.

(Step of Forming Barriers)

Then, as shown in FIGS. 4(f) to 4(h), the reaction product resulting from the dry-etching of the first color filter film 14d is formed as the barriers 17 between the color filters 14, 15 and 16. The barriers 17 are formed of the reaction product of the first color filter material and the dry etching gas. If the first color filter film 14d is anisotropically etched, it is important to control sidewall protective layers that will be formed by adhesion of the reaction product of dry etching to the sidewalls. The shape and amount of adhesion of the reaction product depend on the dry etching conditions.

In the method of producing a solid-state imaging device of the present embodiment, the first color filter film 14d is etched, and then the second and third color filter materials are filled in the openings 20c formed by the etching to thereby form color filters of multiple colors. Accordingly, in dry etching, it is necessary to etch the first color filter film 14d vertically and control the pattern size. Therefore, the shape and amount of adhesion of the reaction product to the sidewalls of the first color filter 14 are required to be controlled.

If the amount of adhesion of the reaction product increases, removal of the etching mask 20 may be difficult. Even if the etching mask 20 can be removed, the color filter material and the sidewall protective layers adhered to the sidewalls of the etching mask 20 may be left as they are. In this case, the sidewall protective layers remained after application of the second or third color filter material may create problems. Therefore, the etching gas and the etching conditions may be adjusted to reduce adhesion of materials to the sidewalls of the first color filter 14, for cancellation of lateral etching during dry etching, thereby enabling vertical etching with less adhesion of materials to the sidewalls. When patterns are formed by dry etching, the etching may be anisotropically performed. However, in the present embodiment, a reaction product described later is used as the barriers 17. Considering this, in the present embodiment, etching is controlled so that adhesion of reaction product is increased in the sidewalls of the first color filter 14.

The color filter patterns structurally create a problem of color mixing due to entry of light, which has passed through the color filter of each color, into different optical elements. As a measure against this problem, it is known to make use of an effect of blocking light between the color filters of the respective colors, or a method of controlling the refractive index to form barriers such that light does not enter different photoelectric conversion elements.

Since the present embodiment uses the Bayer array, the green color filter serves as the first color filter 14. The method of the present embodiment can eliminate or reduce the photosensitive components of the color filter materials, and thus the refractive index of the green color filter material as the first color filter can be controlled, leading to easy control of the refractive indexes with respect to the barriers formed in the present embodiment and the red and blue color filters.

In the present embodiment, the dry etching conditions are set so as to positively form a reaction product which is generated during dry etching and which should have been prevented in the conventional art. Further, the sidewall adhesion layers formed by dry etching are used as the barriers 17 between the color filters 14, 15 and 16.

The present embodiment uses the Bayer array, and the color filter material containing a green pigment is etched to utilize the reaction product as the barriers 17. Generally used green pigments contain metal elements such as of copper and zinc. Accordingly, the reaction product resulting from the reaction with the etching gas used herein will be one which is difficult to be volatilized and removed in etching, and thus the barriers 17 will contain large amounts of metal, such as zinc and copper. Therefore, even when the barriers 17 are thin, light is blocked by a film containing metallic elements in each barrier 17. Thus, the color mixing prevention effect is greatly exerted by providing the barriers 17. Thus, there is an advantage of easily forming the barriers 17 with a thickness of 200 nm or less that is required of the solid-state imaging devices seeking finer patterns. Particularly, the barriers 17 formed of the reaction product can have a thickness of about 50 nm or less, and has an effect of satisfying required light-blocking properties due to the metal components contained therein.

To reduce adhesion of the reaction product to the sidewalls of the first color filter 14 when the color filter material is dry-etched, the amount of chemical reaction is required to be increased in the dry etching. Thus, it is preferred to generate a reaction product that is easily discharged from inside the etching chamber and make the reaction product less likely to adhere to the sidewalls. To this end, it is preferred to increase a fluorine-based gas flow rate or an oxygen-based gas flow rate, from the viewpoint that the first color filter material forming the first color filter film 14d, which is a film to be etched, is an organic material. The fluorine-based gas to be used may be selected, as desired, from, for example, the group of gases consisting of carbon and fluorine, such as $CF_4$, $C_2F_6$, $C_3F_8$, $C_2F_4$ and $C_4F_8$. Further, two or more of the fluorine-based gases may be mixed for use as a dry etching gas.

When a fluorine-based gas is used for dry etching in the production method of the present embodiment, the silicon mainly used in the primer semiconductor substrate 10 may be unavoidably etched, being predominantly led by chemical reaction. Therefore, the fluorine-based gas flow rate is required to be adjusted so as not to be increased more than necessary.

By increasing the reaction of using the physical impact of ions, while reducing chemical reaction, the deposition (amount of adhesion) of the reaction product is increased on the sidewalls of the first color filter 14. For example, a dry etching gas that can be used may be a noble gas, such as helium (He), neon (Ne), argon (Ar), krypton (Kr), or xenon (Xe), and particularly helium or argon is preferred. However, if chemical reaction is reduced, the etching mask 20 may be damaged. If chemical reaction is small, the etch rate may be lowered.

The present embodiment uses a dry etching gas, in which 90% or more of the total gas flow is a noble gas, such as Ar or He, containing less reactive elements, mixed with one or more reactive gases, such as fluorine-based gas and an oxygen-based gas. Use of such an etching gas, coupled with the effect of chemical reaction, improves the etch rate, and increases the reaction product adhering to the sidewalls of the first color filter 14. Thus, the reaction product adhered to the sidewalls of the first color filter 14 can be used as the barriers 17. More specifically, the noble gas that contains less reactive elements, such as Ar and He, preferably occupies 95% or more of the total gas flow.

Adhesion of the reaction product to the sidewalls is apt to depend on the pressure in dry etching. This is because, if the chamber pressure is high, there is a large amount of etching gas or a reaction product in the chamber, and the mean free path of ions will be short, which leads to reducing the physical impact of ions. In the present embodiment, the chamber pressure in dry etching is preferably in the range of 0.01 Pa or more to 8.0 Pa or less, and more preferably 0.1 Pa or more to 3.0 Pa or less. This is because, the pressure in the range of 0.01 Pa or more to 8.0 Pa or less can provide an advantage of easily forming a stable plasma environment, and easily controlling the etching conditions.

If materials are etched under these etching conditions, the amount of adhesion of the reaction product to the sidewalls of the first color filter 14 increases, and removal of the etching mask 20 becomes difficult. Therefore, removal of the etching mask 20 is desired to be facilitated by changing the dry etching conditions in multiple stages, depending on situations. Specifically, it is preferred that the first color filter film 14*d* is etched under the conditions of allowing adhesion of a large amount of reaction product to the sidewalls. Further, the conditions may preferably be such that the first color filter film 14*d* is entirely etched without damaging the surface of the semiconductor substrate 10 when the etching position approaches thereto.

Specifically, in the initial stage, materials may be etched using an etching gas, in which 90% or more of the total gas flow is a less reactive noble gas, mixed with reactive gases. In this case, the first color filter film 14*d* with the initial thickness may preferably be etched in the range of 30% or more to 90% or less, more preferably 50% or more to 80% or less, and even more preferably 60% or more to 70% or less.

At the next stage, materials may be etched using a dry etching gas, in which a less reactive noble gas occupies 80% or less of the total gas flow, mixed with a reactive gas, such as a fluorine-based gas or oxygen-based gas, or a mixture of two or more of these gases. In this case, the amount of noble gas may preferably be 70% or less of the total gas flow, and more preferably 50% or less.

Then, the first color filter film 14*d* is etched with these flow rates in the range not etching the semiconductor substrate 10. Thereafter, with the fluorine-based gas removed, the first color filter film 14*d* is overetched exceeding the thickness thereof, using a gas not chemically etching Si, such as $O_2$ or a noble gas, used singly or in combination of two or more. This overetching can reduce the influence of in-plane etching variation of the semiconductor substrate 10 and can remove the first color filter film 14*d* at desired positions on the entire surface of the semiconductor substrate 10, thereby forming the first color filter 14.

This dry etching provides the first color filter 14 without damaging the primer semiconductor substrate 10 and without forming residues of the color filter material, but forming the barriers 17 with the reaction product of the dry etching. The first color filter 14 has a structure of including the bridges 14*c* and the first color filter patterns 14*a*. Thus, the color filter patterns 15*b* of the second color filter 15 and the color filter patterns 16*b* of the third color filter 16 are independently formed. The barriers 17 are also formed on the sidewalls of the bridges 14*c*. This structure exerts an effect of reducing not only color mixing of the first color filter 14 with the second and third color filters 15 and 16, but also color mixing between the second and third color filters 15 and 16. In addition, formation of the barriers 17 on the sidewalls of the first color filter 14 provides an advantage of reducing unevenness due to the pigment and not affecting the formation of the second and third color filters 15 and 16. Since the reaction product adhered to the sidewalls forms the barriers 17 under these dry etching conditions, the thickness of each barrier 17 that can be formed is limited. However, since the barriers 17 as formed contain metal as mentioned above, they are expected to exert a light-blocking effect.

The overetching in the above etching is performed using a gas that is a mixture of a gas not chemically etching Si, with a noble gas. In the overetching, etching of the planarizing underlayer 12 causes the reaction product to adhere to the sidewalls of the first color filter 14. If the planarizing underlayer 12 contains Si-containing components, the Si-containing components react with the dry etching gas or the atmospheres on the inside or outside of the chamber to thereby form the barriers 17 composed of $SiO_2$ or SiN on the sidewalls of the first color filter 14. When the planarizing underlayer 12 is made of a resin material similar to that of conventional color filters without containing Si, the planarizing underlayer 12 is removed in the overetching. Then, slight etching is applied to the layer that is provided to the surface of the semiconductor substrate 10 for protection and planarization thereof. The slight etching will form the barriers 17 made of $SiO_2$ or SiN, that is, a reaction product resulting from the reaction of the dry etching gas and the peripheral structure material. If a resin material is used for the planarizing underlayer 12, the planarizing underlayer 12 will have a small thickness and, when etched by several etching gases, will be removed in a short time and thus the surface of the semiconductor substrate 10 is highly likely to be etched. When the surface of the semiconductor substrate 10 is etched, the etching, if it is excessive, affects the photoelectric conversion elements 11. Therefore, the level of overetching is required to be adjusted, depending on the material of the planarizing underlayer 12.

As described above, when a material not containing Si is used for the planarizing underlayer 12, slight etching of the surface of the semiconductor substrate 10 enables formation of Si-containing barriers 17 on the sidewalls of the first color filter 14. However, in this case, since the semiconductor substrate 10 is unavoidably etched, the photoelectric conversion elements 11 are likely to be damaged. Therefore, it is preferred to form the planarizing underlayer 12 with a Si-containing material, or use a barrier material layer 30 which will be described later in second to fourth embodiments.

(Step of Removing Photosensitive Resin Mask Material for First Color)

Subsequently, to form the second and third color filter patterns 15*b* and 16*b* of the second and third color filters 15 and 16, the etching mask 20 is removed, as shown in FIG. 4(*h*), which has been used for forming the first color filter patterns 14*b* for the first color. The removal method of the etching mask 20 may be one using a chemical liquid, a solvent, or the like to dissolve and peel the remnant etching mask 20 without affecting the first color filter 14. Alternatively, the etching mask 20 may be removed by a method of using an ashing technique. This is a technique of ashing a photosensitive resin with light excitation or oxygen plasma. These methods may be used in combination. It is preferred that the method to be use is one not affecting the first color filter film 14*d* for the first color.

When each barrier 17 has an end that includes a portion not affecting the barrier 17 as formed and is higher than the first color filter 14, it is preferred to remove the portion. With the removal, the barriers 17 are formed only on the respective sidewalls of the first color filter 14. Specifically, it is more preferred to use a method of peeling using a spray, a paddle or the like, or a method of spraying a solution for cleaning, than a dip cleaning method of removing the etching mask 20 by directly dipping it in a large quantity of liquid. That is, a preferred method is one which includes a cleaning process at the time of removing the etching mask 20 and gives physical cleaning damage.

Examples of the solution for removing the etching mask 20 include organic solvents, such as N-methyl-2-pyrolidone, cyclohexanone, diethylene glycol monomethyl ether acetate, methyl lactate, butyl lactate, dimethyl sulfoxide, diethylene glycol diethyl ether, propylene glycol monomethyl ether, propylene glycol monoethyl ether, and propylene glycol monomethyl ether acetate. These organic solvents may be used singly or in combination of two or more. The solvent to be used in this case is preferably one not affecting the color filter material. The peeling method may use an acid-based chemical, as long as it does not affect the color filter material.

Other methods may also be used than the removal method based on wet etching using a solvent or the like. For example, the method may use an ashing technique or the like of ashing a photosensitive resin by light excitation or oxygen plasma. Specifically, altered portions of the surface layer of the etching mask 20 may be firstly removed by using the ashing technique, and then the remnant layer may be removed by wet etching using a solvent or the like. The etching mask 20 may be removed by ashing so as not to damage the first color filter material. Further, not only a dry process, such as ashing, but also a polishing process, such as CMP (chemical mechanical polishing), may be used.

The residues of the etching mask 20 for the first color need to be reliably removed. This is because the residues can cause color mixing when applying colors to the second and third color filter patterns 15b and 16b. Thus, residues need to be removed by using a known technique for removing the etching mask 20 so as not to affect the first color filter film 14d. When residues are removed as described above, the thickness of the already formed first color filter patterns 14b is very likely to be reduced. Therefore, it is preferred to take a measure, in advance, of forming the first color filter film 14d with a large thickness.

(Step of Forming Second and Subsequent Color Filters)

Subsequently, as shown in FIGS. 5(a) to 5(e), the second and third color filters 15 and 16 are formed, which contain pigments of colors different from that of the first color filter 14. Roughly, two processes may be used for producing patterns of the second and third color filters 15 and 16.

The first process is one for forming the second and third color filters 15 and 16, using the first color filter 14 as a guide pattern, and using a photosensitive color filter material containing a photocuring resin, followed by selective exposure of conventional art to form patterns in the filters.

The second process is one for applying a second color filter material onto the overall surface of the patterned first color filter 14. Then, the resultant object is dry-etched using the patterned photosensitive resin mask material layer as an etching mask to provide openings at positions for providing the third color filter 16. Finally, a third color filter material is applied to the openings, followed by removing the excess color filter material by polishing or the like to thereby form the third color filter 16 in the openings.

(First Process in the Step of Forming Second and Subsequent Color Filters)

First, with reference to FIGS. 5(a) to 5(h), the first process of forming patterns of the second and subsequent color filters will be described.

The first process uses a photosensitive color filter pattern material (color resist) for the second color filter 15. Specifically, a colored photosensitive resin composition is applied to the surface of the first color filter 14 formed with the openings 20c. This colored photosensitive resin composition serves as the second color filter material containing a pigment of a color different from that of the first pigment. Then, using a photomask, the second color filter material is exposed and developed at portions for forming the second color filter 15, followed by partly curing for patterning of the second color filter film to thereby form the second color filter 15. Thereafter, the third color filter 16 is formed by a method similar to the second color filter 15.

Figure 5E:
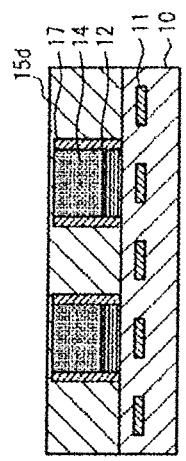
FIGS. 5(a)-5(h) are a set of cross-sectional diagrams sequentially illustrating a first process of forming second and subsequent color filter patterns and microlenses, according to the first embodiment of the present invention.
Figure 5F:
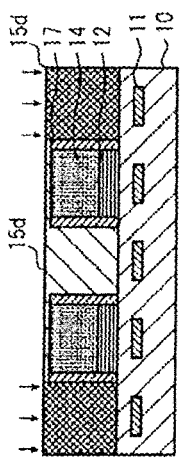
Figure 5G:
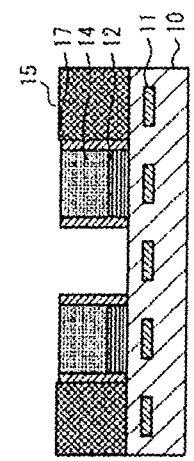
Figure 5H:
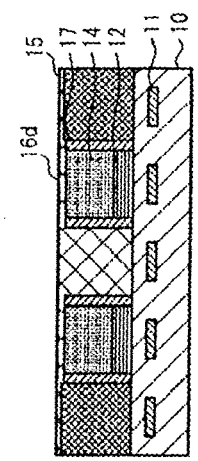
Figure 5A:
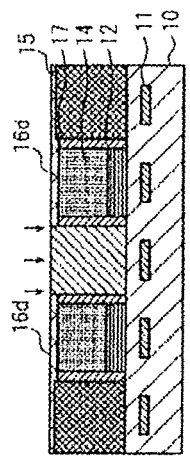

More specifically, first, as shown in FIG. 5(a), a photosensitive color filter material, as the second color filter material, is applied to the entire surface of the semiconductor substrate 10 formed with the first color filter 14, followed by curing to form the second color filter film 15d. The photosensitive color filter material used in this case contains negative photosensitive components which cure with irradiation of light.

Figure 5B:
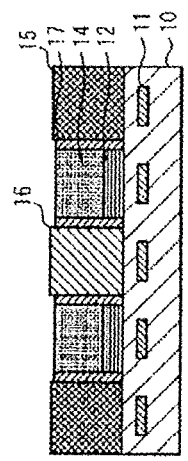

Then, as shown in FIG. 5(b), the second color filter material is exposed at portions for forming the second color filter 15 using a photomask to partially photocure the second color filter film 15d.

Figure 5C:
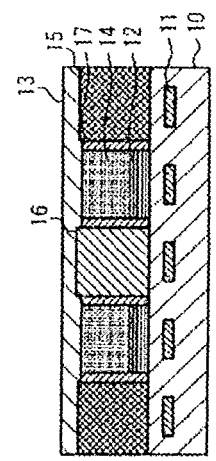

Then, as shown in FIG. 5(c), part of the second color filter film 15d not selectively exposed in development is removed. Then, to improve adhesion between part of the exposed second color filter film 15d and the semiconductor substrate 10 and to improve endurance in usage of the actual device, the remaining second color filter film 15d is cured by high-temperature heating. Thus, the second color filter 15 having the second color filter patterns 15b is formed. The temperature used for curing is preferably 200° C. or more, and more preferably about 230° C.

Figure 5D:
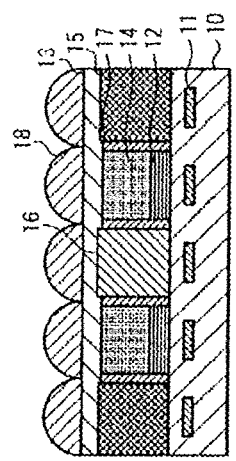

Then, as shown in FIG. 5(d), the third color filter material is applied onto the entire surface of the semiconductor substrate 10 to form the third color filter film 16d. Then, as shown in FIG. 5(e), the third color filter material is selectively exposed at portions for forming the third color filter 16 to partially photocure the third color filter film 16d.

Then, as shown in FIG. 5(f), the photosensitive third color filter film 16d is developed to remove the unexposed portions of the third color filter film 16d. Then, to improve adhesion between part of the exposed second color filter film 16d and the semiconductor substrate 10 and to improve endurance in usage of the actual device, the remaining third color filter film 16d is cured by high-temperature heating. Thus, the third color filter 16 having the third color filter patterns 16b is formed.

The pattern forming processing of the second color filter 15 and the subsequent pattern forming steps is repeated, thereby forming color filters with desired number of colors.

Then, as shown in FIG. 5(g), the planarizing overlayer 13 is formed over the color filters 14, 15 and 16 as formed. The planarizing overlayer 13 may be formed of one or more resin materials. Examples of the resin materials include an acrylic resin and other resins as mentioned above. In this case, the planarizing overlayer 13 can be formed by applying the resin material onto the surface of the semiconductor substrate 10, followed by heating and curing. The planarizing overlayer 13 can be formed of, for example, a compound such as of oxide or nitride as mentioned above. In this case, the planarizing overlayer 13 can be formed by various deposition methods, such as vapor deposition, sputtering and CVD.

Finally, as shown in FIG. 5(*h*), the microlenses 18 are formed on the planarizing overlayer 13. The microlenses 18 are formed by a known technique, such as a method using heat flow, a method of producing microlenses using a gray tone mask, and a method of transferring microlenses to a planarized layer using etchback.

In the method of forming microlenses by patterning based on dry etching, a transparent resin layer finally serving as microlenses is formed first on the color filters. Then, a matrix of microlenses (lens matrix) is formed on the transparent resin layer using a heat flow method. Then, using the lens matrix as a mask, the shape of the lens matrix is transferred to the transparent resin layer by dry etching. By adjusting the etch rate by selecting the height or the material of the lens matrix, an appropriate lens shape can be transferred to the transparent resin layer.

Specifically, after being used for dry etching, the lens matrix for transferring lens shape is removed from the surface to form microlenses with the transparent resin layer. While forming the microlenses, the transparent resin layer is dry-etched until the height of the microlenses becomes substantially equivalent to the thickness of the transparent resin layer. Therefore, the transparent resin layer, which also serves as the planarizing layer on top of the color filters, is preferably made thin as much as possible.

Thus, the solid-state imaging device of the present embodiment is completed.

In the present embodiment, it is preferred that the color filter patterns (first color filter patterns) 14*b* occupying the largest area are formed as the first color filter 14. The second and third color filters 15 and 16 are then formed by photolithography using the second and third color filter materials and photosensitive color resists.

The technique of using photosensitive color resists is the technique of manufacturing color filter patterns based on conventional art. The second color filter 15, which is formed in the openings 20*c* formed in the first color filter 14, is formed using the first color filter 14 as a guide pattern. Even when the color filter materials are photosensitive, resolution of the color resists needs not be emphasized as in the conventional art. Accordingly, the photocuring components in the photocuring resin can be reduced, which leads to increase in the ratio of pigment in the color filter material and thickness reduction of the color filters 14, 15 and 16. In addition, the large area covered with the first color filter 14 exerts an effect of reducing the residues of the second color filter material.

Since the first color filter material is heated at a high temperature after being applied onto the entire surface of the semiconductor substrate 10 or the planarizing underlayer 12, very strong adhesion is achieved with the semiconductor substrate 10 or the planarizing underlayer 12. In this way, the second and third color filters 15 and 16 can be formed so as to fill four-sided portions, by use of the first color filter 14 having good adhesion and good rectangularity as a guide pattern. Thus, the amount of photosensitive components in the color filter material can be reduced. There is another advantage that the second or third color filter patterns 15*b* or 16*b* are formed with good adhesion to the bottom surfaces and sidewalls of the respective recesses formed for forming the second and third color filters 15 and 16.

With such a color filter configuration, the color filters 15 and 16 are each formed in a region enclosed by the first color filter 14. Thus, even when the photosensitivity is so low that pattern formation is not easy with a single photosensitive color resist, the configuration exerts an effect of providing good adhesion between the second and third color filters 15 and 16. Further, the good adhesion enables formation of the color filter patterns 14*b*, 15*b* and 16*b* directly on the semiconductor substrate 10, with omission of the planarizing underlayer 12.

In each portion where the second and subsequent color filters are formed, the planarizing underlayer 12 has been removed when the first color filter is etched. Accordingly, the semiconductor substrate 10 may be exposed to the surface. As mentioned above, semiconductor substrates 10 are mostly provided with a surface protective film made of such a material as $SiO_2$, to protect and flatten the surface. In this case, the surface of the semiconductor substrate 10 has been oxidized and is considered to be hydrophilic. If the second and subsequent color filters are formed on such a surface of the semiconductor substrate 10 by photolithography, the developer may penetrate into the portion where the hydrophilic semiconductor substrate 10 contacts the second and subsequent color filters. Accordingly, the second and subsequent color filter patterns (the second and third color filter patterns 15*b* and 16*b*) may be peeled off. Therefore, depending on the material of the semiconductor substrate 10, the surface of the semiconductor substrate 10 is made hydrophobic using an existing method, such as HDMS (hexamethyldisilazane) treatment, thereby reducing the probability of peeling of the second and subsequent color filter patterns.

In the present embodiment, the first color filter 14 preferably has a lower content of resin components and the like associated with photocuring, and is made of a color filter material having a high pigment concentration. Particularly, the color filter material of the first color is preferably formulated with a pigment content of 70 mass % or more. With this formulation, the first color filter 14 can be accurately formed without leaving residues or causing peeling, even if the first color filter material contains a pigment at a concentration of allowing insufficient curing in photolithography that uses a conventional photosensitive color resist. Specifically, use of a green color filter as the first color filter 14 contributes to reducing the photocuring components of the red color filter or the blue color filter. Thus, the color filter patterns of respective colors can be easily formed by photolithography even if the pigment concentration is increased.

In any case, the initial first color filter 14 is formed using the first color filter material with a reduced content of photosensitive components with emphasis on thermal curing, or the first color filter material with no content of photosensitive components. With this configuration, the first color filter 14 intimately adheres to the semiconductor substrate 10 or the planarizing underlayer 12, eliminating residues produced when forming other color filters, or eliminating peeling from the semiconductor substrate 10 or the planarizing underlayer 12, while achieving high resolution. Then, the second and third color filters 15 and 16 are formed by photolithography, which has fewer processes and thus is more efficient, using photosensitive second and third color filter materials. Thus, the initially formed first color filter patterns 14*b* are accurate, and the second and third color filter patterns 15*b* and 16*b* can be formed into good shapes by photolithography. Further, the first color filter 14 firmly adheres to the semiconductor substrate 10 or the planarizing underlayer 12, exerting an effect of forming the color filter with good adhesion, without causing peeling.

(Second Process in the Step of Forming Second and Subsequent Color Filters)

With reference to FIGS. 6(a) to 6(h), a second process of forming the second and subsequent color filter patterns will be described. The second process will be described, referring to the drawings, taking the case where the second and third color filter films 15d and 16d used for the second and third color filters 15 and 16 are formed of color filter materials having no photosensitivity.

Figure 6A:
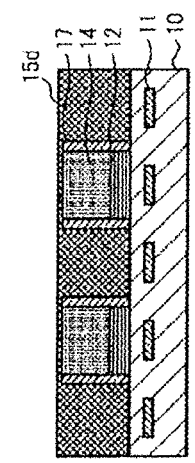
FIGS. 6(a)-6(h) are a set of cross-sectional diagrams sequentially illustrating a second process of forming second and subsequent color filter patterns, according to the first embodiment of the present invention.

As shown in FIG. 6(a), a second color filter material is applied onto the entire surface of the substrate on which the first color filter 14 has been formed. The second color filter material used in this case is a thermosetting resin material having no photosensitivity and curable by heating. Since the second color filter material has no photosensitivity, addition of photosensitive components is not necessary and the pigment concentration can be increased, as mentioned above. Thus, the thickness, the refractive index, and the like of the second color filter 15 are easily controlled. Then, the second color filter material is heated at a high temperature, for curing and formation of the second color filter film 15d. The heating temperature is preferably one not affecting the device, specifically 300° C. or less, and more preferably 240° C. or less.

As shown in FIG. 6(a), a large amount of the second color filter material needs to be applied to achieve uniform thickness in the second color filter film 15d. Thus, excess second color filter material is provided on the first color filter 14. The excess second color filter material is removed by being etched back through polishing, such as CMP, or dry etching. The second color filter material may be removed by a known technique such as of planarizing the film or reducing the thickness of the film as desired. The excess second color filter film 15d may be removed finally after forming the color filters 14, 15 and 16 of respective colors, as long as the final removal creates no problem during etching for providing openings for forming the third color filter 16 as will be described later.

Figure 6B:
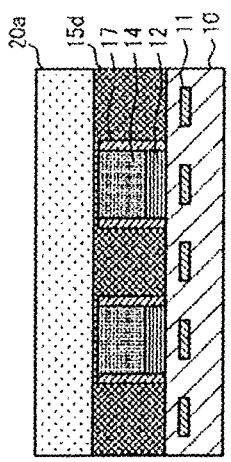

Then, as shown in FIG. 6(b), a photosensitive resin mask material is applied onto the second color filter film 15d to form the photosensitive resin mask layer 20a.

Figure 6C:
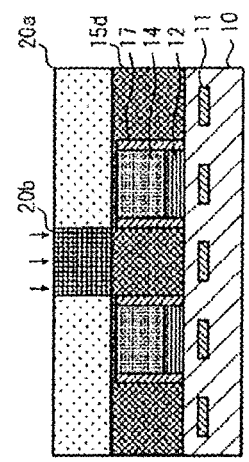
Figure 6D:
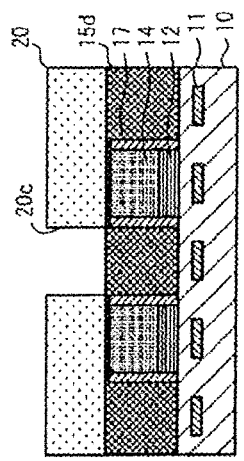

Subsequently, as shown in FIGS. 6(c) and 6(d), the resin mask layer 20a is exposed and developed to form patterns 20b so that openings are provided for arranging the third color filter 16. The photosensitive resin mask layer 20a with the patterns 20b formed therein is developed to remove the patterns 20b and to form the openings 20c, thereby forming the etching mask 20.

Figure 6E:
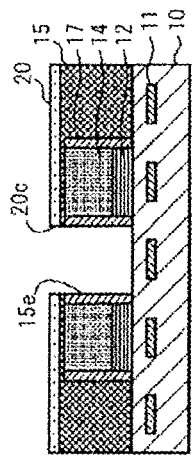
Figure 6F:
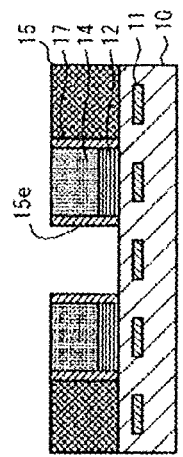

Subsequently, as shown in FIG. 6(e), the second color filter film 15d is removed at portions by dry etching using the etching mask 20 provided with the openings 20c to form openings 15e. The film 15d in these portions is unwanted, for these portions correspond to regions where the third color filter 16 is arranged. In this case, the etching mask 20 may be cured such as by heating or ultraviolet irradiation. As shown in FIG. 6(f), the etching mask 20 is removed by a known removal method, such as peeling by solvent, cleaning, or aching by light excitation or oxygen plasma. As a result of the processing set forth above, the openings 15e are formed at positions for forming the third color filter 16, and the rest of the portions is formed with the first and second color filters 14 and 15.

Figure 6G:
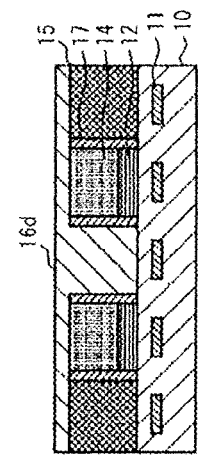
Figure 6H:
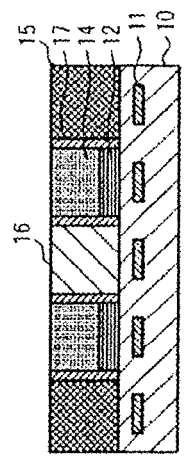

As shown in FIG. 6(g), a third color filter material is applied onto the entire surface of the substrate, on which the first and second color filters 14 and 15 are formed, to fill the openings 15e, followed by curing to form the third color filter film 16d. After that, as shown in FIG. 6(h), the excess third color filter film 16d on the first and second color filters 14 and 15 is removed to form the third color filter 16.

In the case of forming the fourth and subsequent color filters, the color filter materials are each applied and cured similarly to the second and third color filters 15 and 16. After that, the resultant object is dry-etched using an etching mask 20 that is a photosensitive resin material provided with openings by patterning, followed by removing the excess photosensitive resin mask layer 20a, thereby forming color filters of respective colors.

At the stage where each color filter material has been applied and cured, the subsequent color filter material may be applied, without planarizing or removing the excess color filter material by polishing or etchback. In this case, in some portions, two or more color filter materials among the first, second and third color filter materials may be overlapped. Therefore, part of the color filters may finally be removed using a known technique. Specifically, polishing, such as CMP, or dry etching, such as etchback, may be applied to the color filters to planarize or reduce the filters to a predetermined thickness. Thus, the color filters 14, 15 and 16 of respective colors can be formed without steps therebetween. In this case, since the color filters form a stepless structure, microlenses can be formed by a known microlens forming method without the necessity of providing a planarizing overlayer 13.

The first process set forth above is a method of forming the second color filter 15 and subsequent color filters by photolithography. In the first process, the color filter materials for the second color filter 15 and subsequent color filters are imparted with photocurability and selectively exposed and developed to form the color filters.

The second process set forth above is a method of repeatedly applying dry etching to the color filters. In the second process, the color filter materials for the second color filter 15 and subsequent color filters are permitted to contain thermosetting components instead of being imparted with photocurability, and are applied to the entire surface of the substrate and thermally cured. Then, a photosensitive color filter film is formed, as an etching mask, on the second color filter 15 and subsequent color filters, portions of which are desired to be left unremoved, to prepare the second color filter 15 and subsequent color filters by dry etching. In these two processes, the same processes are repeated to form the second and third color filters. However, these processes may be combined, as long as desired spectral characteristics can be obtained.

(Color Filters of Four or More Colors)

When producing color filters of four or more colors, the third and subsequent color filters can be formed by repeating processing similar to that of the second color filter 15 described above. The color filter of the last color may be formed through processing similar to that of the third color filter 16 described above. With this processing, the color filters of four or more colors can be produced.

Advantageous Effects

The first embodiment of the invention has the following advantageous effects.

(1) Since the barriers 17 are provided between the first color filter 14 and the second and third color filters 15 and 16, and between the second and third color filters 15 and 16, color mixing in the display pixels is reduced.

(2) According to the method of producing a solid-state imaging device of the present embodiment, the reaction product produced during dry etching at the time of forming the second and subsequent color filters and adhered to the sidewalls of the first color filter is used as barriers (first wall portions) between the color filters of respective colors.

(3) According to the method of producing a solid-state imaging device of the present embodiment, materials are etched using a dry etching gas, in which 90% or more of the total gas flow is a noble gas containing less reactive elements, mixed with a dry etching gas that contains one or more reactive gases, such as fluorine-based gas and an oxygen-based gas. Using such a dry etching gas, etch rate is improved by the chemical reaction, and the reaction product adhering to the sidewalls is increased. Thus, the reaction product permitted to adhere to the sidewalls of the first color filter can be used as the barriers 17.

(4) According to the method of producing a solid-state imaging device of the present embodiment, the second and subsequent color filter materials are cured by high-temperature heating, using the first color filter 14 as a guide pattern. Accordingly, adhesion between the semiconductor substrate and the color filters is improved, in the absence of the planarizing underlayer from under the second and subsequent color filter materials.

(5) According to the method of producing a solid-state imaging device of the present embodiment, the planarizing underlayer can be omitted if the protective film is formed on the surface of the semiconductor substrate as a material supply source for forming the barriers.

(6) According to the method of producing a solid-state imaging device of the present embodiment, the method uses a first color filter material not containing photosensitive components but containing a first pigment at a concentration of 70 mass % or more, in the step of forming the first color filter film. With this formulation, the first color filter is accurately formed without leaving residues or causing peeling, even if the first color filter material is mixed with a pigment at a concentration of allowing insufficient curing in photolithography that uses a conventional photosensitive color resist.

2. Second Embodiment

Figure 7:
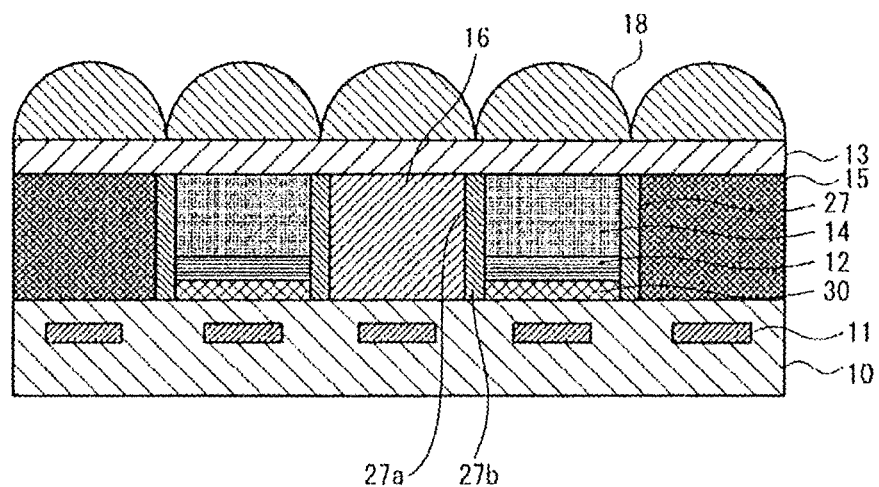
FIG. 7 is a schematic cross-sectional diagram illustrating a configuration example of a solid-state imaging device, according to a second embodiment of the present invention.

Referring now to FIGS. 7 to 8(*j*), a description will be given of a solid-state imaging device and a method of producing the same according to a second embodiment of the present invention.

(2-1) Configuration of Solid-State Imaging Device

The solid-state imaging device according to the second embodiment is characterized in that the device includes a semiconductor substrate that is provided thereon with a barrier material layer to serve as a material supply source of a reaction product that forms barriers. When a first color filter is formed by etching, barriers can be formed by the reaction product of the material of the barrier material layer and the dry etching gas, besides the barriers formed by the reaction product of the first color filter material and the dry etching gas.

As shown in the cross-sectional structure of FIG. 7, the solid-state imaging device of the second embodiment of the present invention includes a semiconductor substrate 10 having a plurality of two-dimensionally arranged photoelectric conversion elements 11, and microlenses 18. Further, the solid-state imaging device of the second embodiment includes color filters 14, 15 and 16 of respective colors provided between the semiconductor substrate 10 and the microlenses 18, barriers 27 provided between the color filters 14, 15 and 16, a planarizing underlayer 12 partially provided above the semiconductor substrate 10, and a planarizing overlayer 13 provided over the surfaces of the color filters 14, 15 and 16 and the barriers 27. The solid-state imaging device of the second embodiment also includes a barrier material layer 30 provided between the semiconductor substrate 10 and the first color filter 14.

In the solid-state imaging device of the second embodiment, components similar to those of the solid-state imaging device of the first embodiment are given the same reference signs. Specifically, the semiconductor substrate 10 having photoelectric conversion elements 11, the planarizing underlayer 12, the color filters 14, 15 and 16, the planarizing overlayer 13, and the microlenses 18 respectively have configurations similar to those of the solid-state imaging device of the first embodiment. Therefore, detailed description will be omitted for components common to those of the solid-state imaging device of the first embodiment.

(Barrier Material Layer)

The barrier material layer 30 transmits visible light and is provided under the first color filter 14. For example, the barrier material layer 30 is a transparent layer transmitting visible light in the range of 380 nm to 700 nm and is provided on the semiconductor substrate 10. When the barriers 27 are formed, the barrier material layer 30 supplies a material that will be second wall portions of the barriers 27. Specifically, the barriers 27 include second wall portions 27*b* that contain a reaction product of the barrier material, which is contained in the barrier material layer 30, and the dry etching gas.

The barrier material layer 30 preferably has a single- or multi-layer structure which contains at least one of silicon and metal as the barrier material. More preferably, the barrier material layer 30 may include a layer selected from the group consisting of a silicon layer, a silicon compound layer, a metal thin film layer, and a mixture layer of silicon and a silicon compound. As the barrier material, for example, an oxidized compound, such as $SiO_2$, or a nitride compound, such as SiN is used. Particularly, a Si-containing material is preferred because $SiO_2$ can be formed as the barriers 27. A metal thin film layer may be formed, if it allows passage of a sufficient amount of visible light therethrough. Metal materials that can be used include titanium, tungsten, copper, aluminum, metal compounds thereof, and the like.

The barrier material layer 30 preferably has a thickness in the range of 1 nm or more to 100 nm or less, and more preferably 10 nm or more to 50 nm or less. The refractive index and reflectance of the barriers 27 can be adjusted by adjusting the composition and thickness of the barrier material layer 30. As described in the first embodiment, the distance from the color filters 14, 15 and 16 to the photoelectric conversion elements 11 is preferably shorter. Accordingly, a thinner barrier material layer 30 is more preferred. For example, if the barrier material layer 30 is too thin, the thickness of each barrier 27 will be insufficient, and there may be a probability of causing unevenness in the plane of the barrier material layer 30. If the barrier material layer 30 is too thick, the distance from the color filters 14, 15 to 16 to the photoelectric conversion elements 11 will be large, thereby increasing the probability of causing color mixing.

(Barriers)

The barriers 27 of the second embodiment are each provided at the sidewalls of the first color filter 14, the planarizing underlayer 12, and the barrier material layer 30. Each barrier 27 includes a first wall portion 27*a* containing a reaction product of the first color filter material and the dry etching gas, and a second wall portion 27*b* provided to the sidewall of the barrier material layer 30 and containing a reaction product of the barrier material, which is contained in the barrier material layer 30, and the dry etching gas. Each barrier 27 also includes a third wall portion additionally containing a reaction product of a planarizing underlayer material, which is contained in the planarizing underlayer 12, and the dry etching gas. Thus, the barriers 27 of the second embodiment each include the second wall portion 27b below the first wall portion 27a.

Each barrier 27 may have a two-layer structure (structure that is twofold in the thickness direction of the barrier 27) in which the second wall portion 27b is also provided on the outside of the first wall portion 27a, the second wall portion 27b containing the reaction product of the barrier material, which is contained in the barrier material layer 30, and the dry etching gas.

Each barrier 27 preferably has a thickness of 200 nm or less, and more preferably 100 nm or less in consideration of light that is incident thereon from immediately above the barrier. The thickness of each barrier 27 may more preferably be about 50 nm, as long as the required refractive index and light-blocking properties are satisfied. As mentioned above, the thickness of the barrier 27 is adjusted by the composition and thickness of the barrier material layer 30.

In the second embodiment as well, the planarizing underlayer 12 does not have to be provided, as long as the barrier material layer 30 planarizes the semiconductor substrate 10 and the adhesion of the first color filter 14 is improved. The planarizing overlayer 13 does not have to be provided as long as the color filters 14, 15 and 16 are formed flatly. In the second embodiment, the barrier material layer 30 and the planarizing underlayer 12 provided under the second and subsequent color filters (second and third color filters 15 and 16) are removed by dry etching.

(2-2) Method of Producing Solid-State Imaging Device

Referring to FIGS. 8(a)-8(j), a method of producing the solid-state imaging device of the second embodiment of the present invention will be described.

Figure 8A:
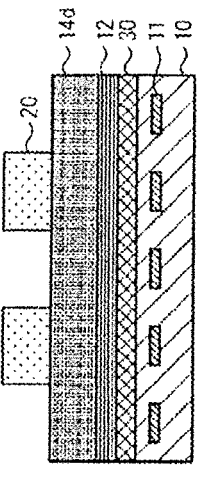
FIGS. 8(a)-8(j) are a set of cross-sectional diagrams sequentially illustrating a process of forming openings for forming first color filter patterns and second and subsequent color filter patterns, according to the second embodiment of the present invention.

A semiconductor substrate 10 having a plurality of two-dimensionally arranged photoelectric conversion elements 11 as shown in FIG. 8(a) is used in the method. On a surface of the substrate, a transparent barrier material layer 30 of a predetermined thickness is formed. The barrier material layer 30 transmits visible light with a wavelength in the range of 380 nm to 700 nm. The barrier material layer 30, if it is an oxide film, such as $SiO_2$, can be formed by using a method of applying SOG (spin on glass) or the like to the film, followed by heating and curing, or by using various deposition methods, such as vapor deposition, sputtering, and CVD. The aforementioned barrier material layer satisfying the film thickness transparency can be formed using various deposition methods.

Figure 8B:
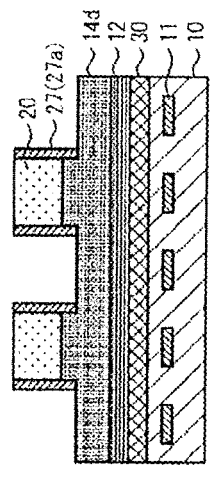
Figure 8C:
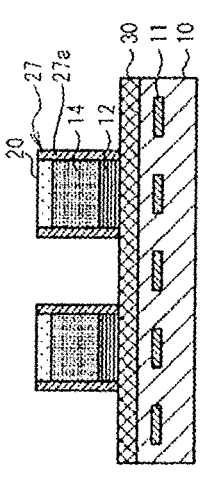
Figure 8D:
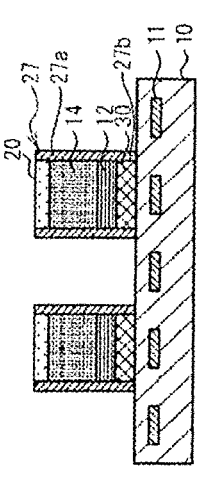
Figure 8E:
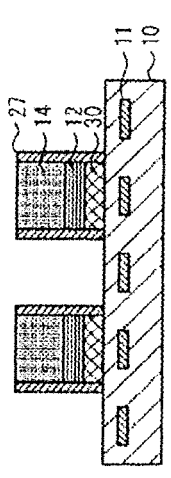
Figure 8F:

As shown in FIG. 8(b), the planarizing underlayer 12 is formed on the transparent barrier material layer 30. The planarizing underlayer 12 does not have to be provided, as long as the semiconductor substrate 10 is planarized by the barrier material layer 30. The planarizing underlayer 12, which has an effect of improving adhesion of the color filter, may preferably be formed if the adhesion lowers due to the material of the barrier material layer 30.

Then, as shown in FIGS. 8(c) to 8(f), a first color filter film 14d is formed, followed by forming a photosensitive resin mask layer 20a thereon, which is further followed by exposure and development for patterning. Thus, an etching mask 20 is formed. The processing, conditions and materials used herein are similar to those used in the processing of the first embodiment shown in FIGS. 4(b) to 4(e).

Figure 8G:
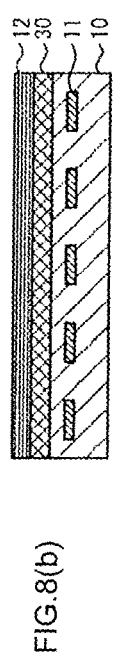
Figure 8H:
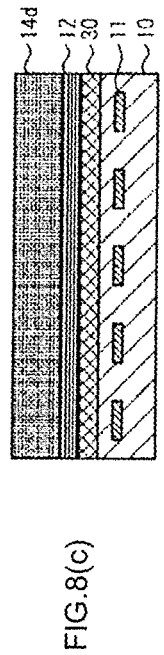
Figure 8I:
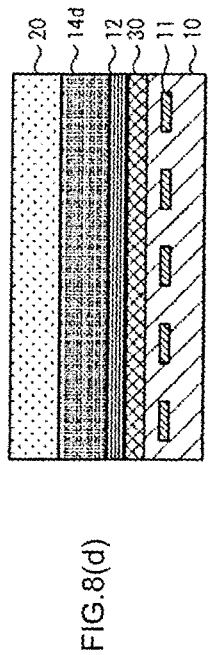

Then, as shown in FIGS. 8(g) to 8(i), the first color filter film 14d is dry-etched and patterned using the etching mask 20. The etching gas used for dry etching is the same as that in the first embodiment. In the initial stage of etching of the second embodiment as well, materials are etched using an etching gas, in which 90% or more of the total gas flow is a noble gas that performs etching mainly by physical impact of ions, mixed with a fluorine-based gas or an oxygen-based gas. Use of such an etching gas, being coupled with the effect of chemical reaction, improves the etch rate. However, if materials are etched for a long time using such a gas causing chemical reaction, there is a high probability of etching the primer semiconductor substrate 10. To cope with this, multi-stage etching is performed by changing the etching gas halfway or changing the ratio of the mixed gas halfway, without fully etching the first color filter film 14d.

In the second embodiment, the barrier material layer 30 provided under the planarizing underlayer 12 is provided with a layer, such as an oxide film or a nitride film containing Si, or a layer of a mixture thereof, which is assumed to be removed by etching. Therefore, the structure can favorably provide a larger etching margin when using an etching gas causing a chemical reaction of a fluorine-based gas or an oxygen-based gas, comparing with the structure of the first embodiment in which the semiconductor substrate 10 not desired to be removed by etching is provided directly below the materials to be etched.

Specifically, the etching gas to be used may be one composed of a fluorine-based gas or an oxygen-based gas causing a chemical reaction, or a mixture of these gases, and a noble gas containing less reactive elements, such as Ar or He. When using such an etching gas, the less reactive noble gas is ensured to occupy 80% or less of the total gas flow in the initial stage of etching. The less reactive noble gas preferably occupies 70% or less of the total gas flow, and more preferably 50% or less. Such a formulation of the etching gas enables etching of 60% or more to 95% or less of the initial thickness of the first color filter film 14d. Considering the in-plane evenness, it is preferred to etch 80% or more to 90% or less of the initial thickness of the first color filter film 14d. During this etching, the reaction product of the first color filter film 14d and the etching gas adheres to the sidewalls of the first color filter film 14d to form the first wall portions 27a of the barriers. If a green pigment is used for the first color filter film 14d, a reaction product containing Zn or Cu adheres to the sidewalls and is formed into the barriers 27. As shown in FIG. 8(g), adhesion of the reaction product onto the sidewalls continues until the first color filter film 14d disappears.

Then, as shown in FIG. 8(h), the fluorine-based gas is removed, followed by overetching the first color filter film 14d to a depth of not less than the thickness thereof. For example, the gas used in the overetching is an oxygen gas or a noble gas used singly or in combination of two or more. As shown in FIGS. 8(h) and 8(i), overetching involves etching of the planarizing underlayer 12 and the barrier material layer 30 under the first color filter film 14d. This processing provides a surface with reduced etching residues of the first color filter 14. In this case, the etching gas used is one causing less chemical reaction but causing a large physical impact of ions. Accordingly, simultaneously with the etching of the barrier material layer 30, the reaction product of the material of the barrier material layer 30 and the etching gas adheres to the sidewalls of the first color filter 14. Thus, while the barrier material layer 30 is etched, the reaction product of the first color filter material and the etching gas adheres to the sidewalls of the first color filter film 14d to form the first wall portions, and the reaction product of the material for the barrier material layer 30 and the etching gas adheres to the outer side of the first wall portions to form the second wall portions. If the barrier material layer 30 contains Si, the material of the barrier material layer 30 reacts with oxygen to form a $SiO_2$ film on the sidewalls of the first color filter 14. This formation processing forms the barriers 27 of two-layer structure on the sidewalls of the first color filter 14 in the thickness direction of the barriers 27.

If a less reactive noble gas is used for overetching, the photosensitive resin mask material forming the etching mask 20 may be damaged and cured, which may make removal difficult. Therefore, etching with $O_2$ (aching) may preferably be performed even for a short time at the end of etching. With this processing, damaged layers on the surface of the etching mask 20 are removed, and the photosensitive resin mask material is easily removed by a solvent, such as a peeling liquid. In addition, the dry etching performed in vacuum may exert an effect of oxidizing Si in the reaction product, which is adhered to the sidewalls of the first color filter 14, with the oxygen etching, and turning to $SiO_2$.

Figure 8J:
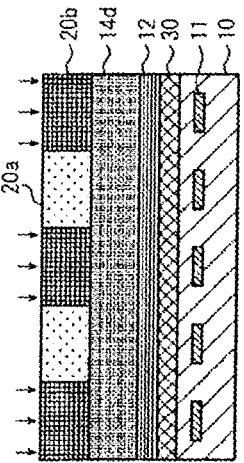

As shown in FIG. 8(i), the barrier material layer 30 may be etched until reaching the surface of the semiconductor substrate 10. Then, the etching mask 20 may be removed to form the first color filter 14, as shown in FIG. 8(j). In the present embodiment, the planarizing underlayer 12 and the barrier material layer 30 partially remain under the first color filter 14.

The second and third color filters 15 and 16, the planarizing overlayer 13, and the microlenses 18 can be formed through processing similar to that of the first embodiment, as shown in FIGS. 5(a) to 5(h).

(Color Filters of Four or More Colors)

Color filters of four or more colors can be formed similarly to the method described in the first embodiment. Specifically, the first color filter 14, under which the planarizing underlayer 12 and the barrier material layer 30 are provided, may be formed first, and then the third and subsequent color filters may be formed by repeating processing similar to one used for forming the second color filter 15. The color filter of the last color may be formed through processing similar to that of the third color filter 16 described above. With this processing, the color filters of four or more colors can be produced.

Advantageous Effects

The second embodiment of the invention further has the following advantageous effects, in addition to those described in the first embodiment.

(7) The refractive index and reflectance of the barriers are easily adjusted by adjusting the composition and the thickness of the barrier material layer which serves as a material supply source of a reaction product that forms the barriers on the semiconductor substrate of the solid-state imaging device.

3. Third Embodiment

Figure 9:
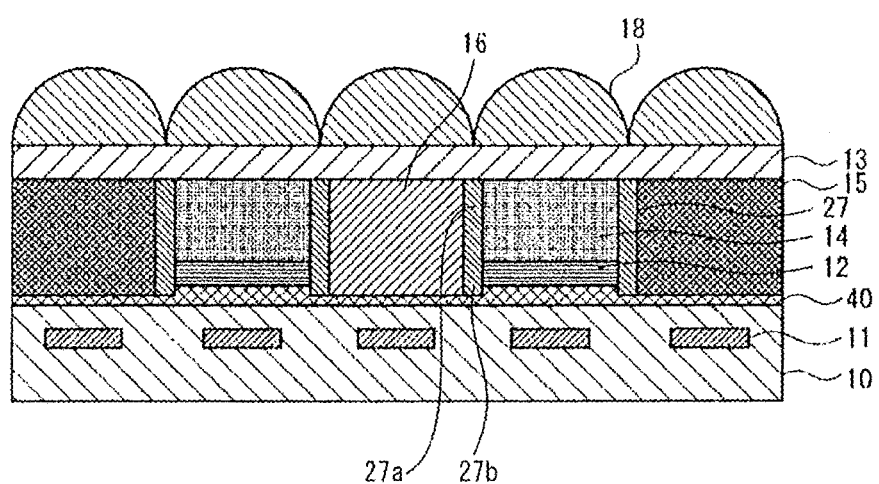
FIG. 9 is a schematic cross-sectional diagram illustrating a configuration example of a solid-state imaging device, according to a third embodiment of the present invention.
Figure 10:
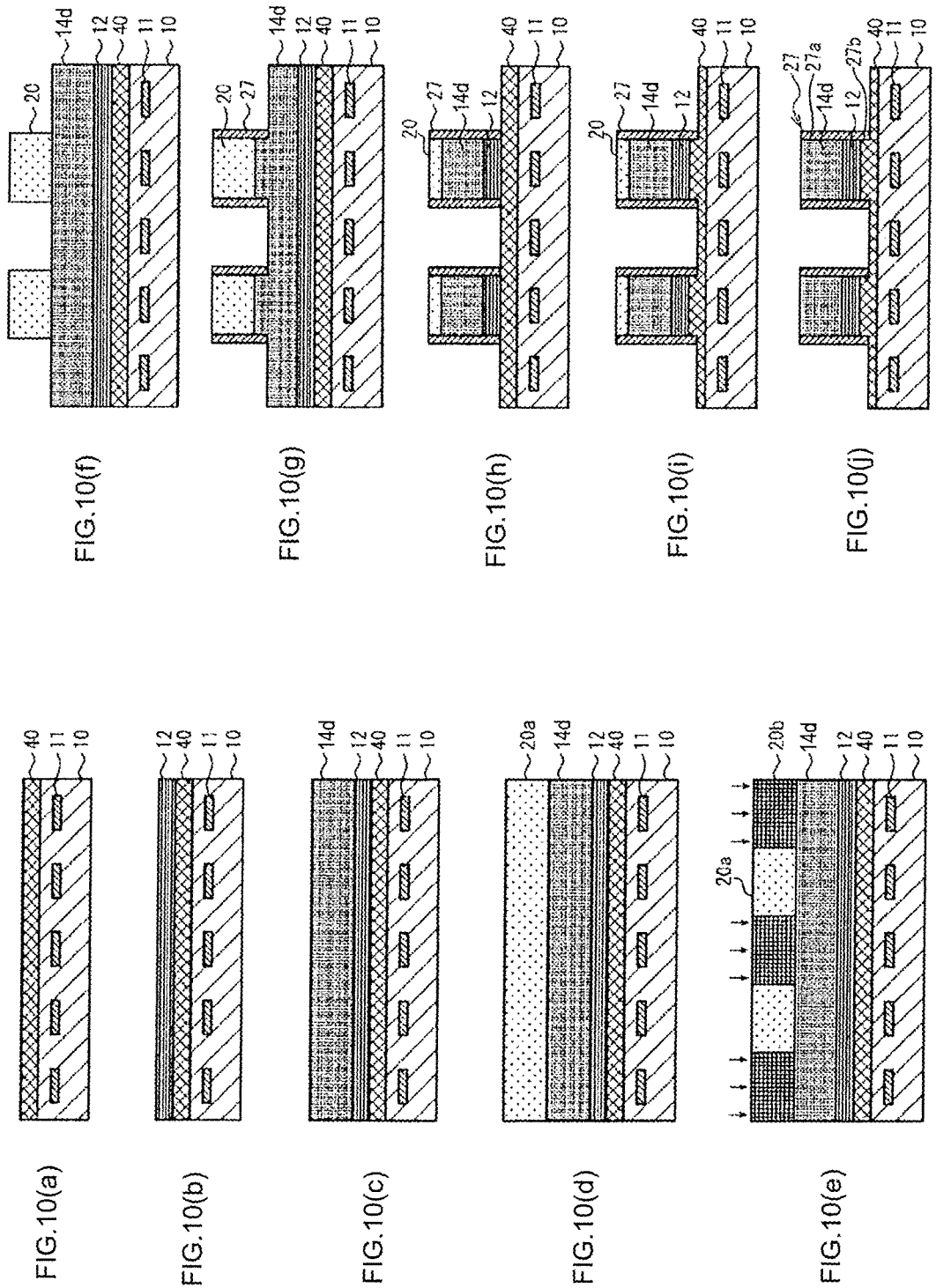
FIGS. 10(a)-10(j) are a set of cross-sectional diagrams sequentially illustrating a process of forming openings for forming first color filter patterns and second and subsequent color filter patterns, according to the third embodiment of the present invention.

Referring to FIGS. 9 to 10(j), a solid-state imaging device and a method of producing the same according to a third embodiment of the present invention will be described.

(3-1) Configuration of Solid-State Imaging Device

The solid-state imaging device according to the third embodiment is characterized in that a barrier material layer is provided under each of a plurality of color filters. The barrier material layer serves as a material supply source of a reaction product that forms barriers on the semiconductor substrate. The solid-state imaging device according to the third embodiment is different from the second embodiment in that a barrier material layer is also provided under the second and third color filters.

As shown in the cross-sectional structure of FIG. 9, the solid-state imaging device of the third embodiment of the present invention includes a semiconductor substrate 10 having a plurality of two-dimensionally arranged photoelectric conversion elements 11, and microlenses 18. Further, the solid-state imaging device of the third embodiment includes color filters 14, 15 and 16 of respective colors provided between the semiconductor substrate 10 and the microlenses 18, barriers 27 provided between the color filters 14, 15 and 16, a planarizing underlayer 12 partially provided above the semiconductor substrate 10, and a planarizing overlayer 13 provided over the surfaces of the color filters 14, 15 and 16 and the barriers 27. The solid-state imaging device of the third embodiment also includes a barrier material layer 40 provided between the semiconductor substrate 10 and the microlenses 18. The barrier material layer 40 is provided under the plurality of color filters 14, 15 and 16. The barrier material layer 40 is partially removed by etching, that is, not completely removed. The barrier material layer 40 prevents damage of the semiconductor substrate 10 during etching, and protects the surface of the semiconductor substrate 10.

In the solid-state imaging device of the second embodiment, components similar to those of the solid-state imaging devices of the first and second embodiments are given the same reference signs. Specifically, the semiconductor substrate 10 having photoelectric conversion elements 11, the planarizing underlayer 12, the color filters 14, 15 and 16, the planarizing overlayer 13, and the microlens 18 respectively have configurations similar to those of the components of the solid-state imaging devices of the first and second embodiments. In addition, each barrier 27 has the same configuration as that of each barrier 27 of the solid-state imaging device of the second embodiment. Therefore, detailed description will be omitted for components common to those of the solid-state imaging devices of the first and second embodiments.

(Barrier Material Layer)

The barrier material layer 40 transmits visible light and is provided under the first, second and third color filters 14, 15 and 16. The barrier material layer 40 is continuous under the first, second and third color filters 14, 15 and 16. The barrier material layer 40 is formed so that the bottom of each barrier 27 does not reach the semiconductor substrate 10, and lies between the bottoms of the barriers 27 and the semiconductor substrate 10. Specifically, in the method of producing a solid-state imaging device, the solid-state imaging device of the third embodiment is obtained by not fully etching the barrier material layer 40 when a first color filter film 14d is etched at positions where the second and third color filters 15 and 16 are formed.

Except the shape described above, the configuration of the barrier material layer 40 is similar to that of the second embodiment. Specifically, for example, the barrier material layer 40 provided on the semiconductor substrate 10 is a transparent layer transmitting visible light in the range of 380 nm to 700 nm, and supplying a material for use in forming the barriers 27. The barriers 27 contain a reaction product of the barrier material, which is contained in the barrier material layer 40, and the dry etching gas.

The barrier material that can be used for forming the barrier material layer 40 may be ones mentioned in the second embodiment.

When the materials are etched using a less reactive noble gas and if the barrier material layer 40 is formed of an oxide film or a nitride film such as of $SiO_2$ or SiN, or a film of a mixture of them, the etch rate of the layer 40 becomes lower than the first color filter film 14d and the planarizing underlayer 12. Accordingly, the barrier material layer 40 should remain even after complete removal of the residues and the like that are left as a result of etching the first color filter film 14d. While the barrier material layer 40 remains, the semiconductor substrate 10 is not exposed to the etching gas. Accordingly, the semiconductor substrate 10 is much less likely to be damaged by etching. Also, the barrier material layer 40, which is transparent to visible light, does not affect the second and third color filters 15 and 16 even if it remains. Depending on the thickness of the barrier material layer 40 permitted to remain, the planarizing underlayer 12 and the barrier material layer 40 remain under the first color filter 14. On the other hand, it is only the barrier material layer 40 that remains under the second and third color filters 15 and 16. Therefore, the film thickness and phase difference can be adjusted. If the photosensitive components are mixed in the second and third color filters 15 and 16, there is an advantage that film thickness can be adjusted to obtain desired spectral characteristics, if the thickness of the second and third color filters 15 and 16 becomes slightly larger than the first color filter 14.

The thickness of the barrier material layer 40 is preferably in the range of 30 nm or more to 100 nm or less. As mentioned above, as the distance between the color filters 14, 15 and 16 and the photoelectric conversion elements 11 is smaller, color mixing is less likely to occur. Accordingly, it is especially preferred that the barrier material layer 40 and the planarizing underlayer 12 each have a smaller thickness. If the thickness of the barrier material layer 40 is so small as, for example, less than 30 nm, the barrier material layer 30 may preferably have the configuration described in the second embodiment. If the thickness of the barrier material layer 40 is made comparatively large so as to be in the range, for example, of 30 nm or more to 100 nm or less, or if the etch rate of the barrier material layer 40 is low due to the less reactive noble gas, the barrier material layer 40 may preferably have the configuration described in the present embodiment.

(3-2) Configuration of Solid-State Imaging Device

Referring to FIGS. 8(a)-8(j), a method of producing the solid-state imaging device of the third embodiment of the present invention will be described.

The processing of providing a planarizing underlayer 12 and a first color filter film 14d on the surface of the semiconductor substrate 10 and forming an etching mask 20 thereon as shown in FIGS. 10(a) to 10(f) is similar to that of the second embodiment as shown in FIGS. 8(a) to 8(f), and therefore description is omitted.

Then, as shown in FIGS. 10(g) to 10(i), the first color filter film 14d is dry-etched and patterned using the etching mask 20. The etching gas used in the dry etching is similar to ones used in the first and second embodiments.

As shown in FIGS. 10(g) and 10(h), processing of etching before completing etching of the first color filter film 14d and the planarizing underlayer 12 is similar to the processing of the second embodiment shown in FIGS. 8(g) and 8(h). Then, as shown in FIG. 10(i), in the third embodiment, the barrier material layer 40 is etched halfway and the etching is finished before completion.

Then, as shown in FIG. 10(j), dry etching of the barrier material layer 40 is stopped before reaching the surface of the semiconductor substrate 10. Then, the etching mask 20 is removed to form the first color filter 14 and the barriers 27. In the present embodiment, the planarizing underlayer 12 and the barrier material layer 40 partially remain under the first color filter 14.

The second and third color filters 15 and 16, the planarizing overlayer 13, and the microlenses 18 can be formed through processing similar to that of the first embodiment, as shown in FIGS. 5(a) to 5(h).

(Color Filters of Four or More Colors)

Color filters of four or more colors can be formed similarly to the method described in the first embodiment. Specifically, the first color filter 14, under which the planarizing underlayer 12 and the barrier material layer 40 are provided, may be formed first, and then the third and subsequent color filters may be formed by repeating processing similar to one used for forming the second color filter 15. The color filter of the last color may be formed through processing similar to that of the third color filter 16 described above. With this processing, the color filters of four or more colors can be produced.

Advantageous Effects

The third embodiment of the invention further has the following advantageous effects, in addition to those described in the first and second embodiments.

(8) The barrier material layer is partially removed by etching, that is, remains covering the semiconductor substrate, without being completely removed. Thus, the barrier material layer prevents damage of the semiconductor substrate during etching and protects the surface of the semiconductor substrate.

4. Fourth Embodiment

Figure 11:
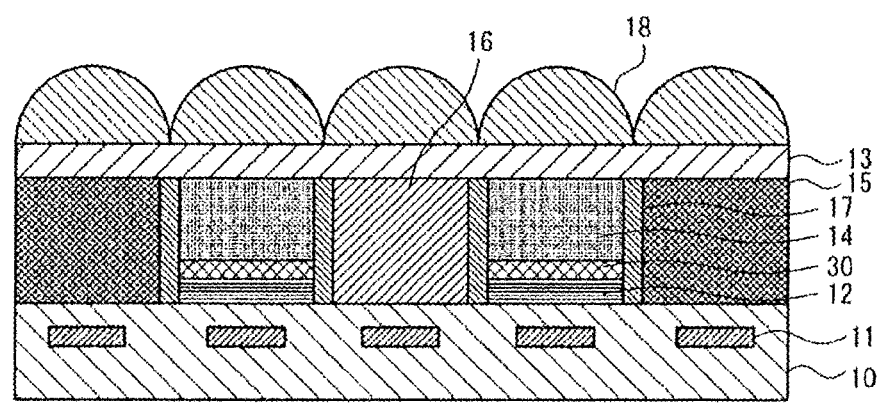
FIG. 11 is a schematic cross-sectional diagram illustrating a configuration example of a solid-state imaging device, according to a fourth embodiment of the present invention.
Figure 12F:
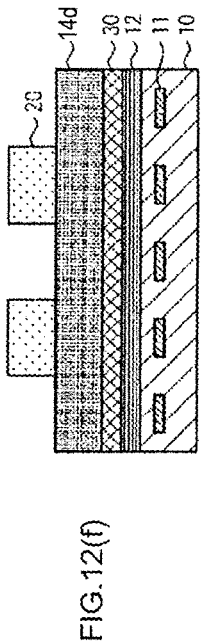
FIGS. 12(a)-12(j) are a set of cross-sectional diagrams sequentially illustrating a process of forming openings for forming first color filter patterns and second and subsequent color filter patterns, according to the fourth embodiment of the present invention.
Figure 12G:
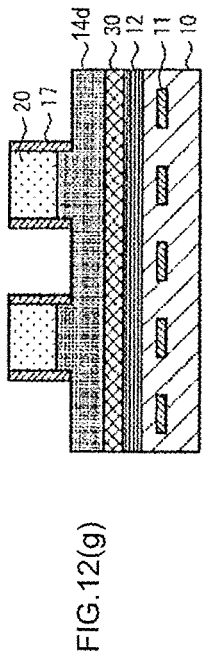
Figure 12H:
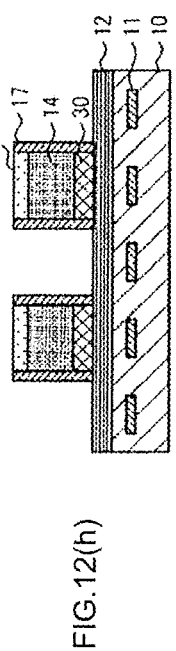
Figure 12I:
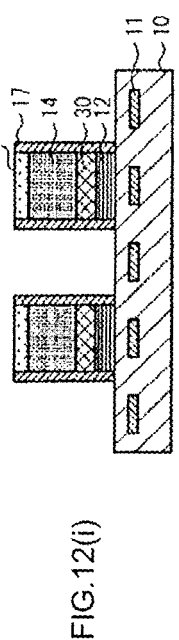
Figure 12J:
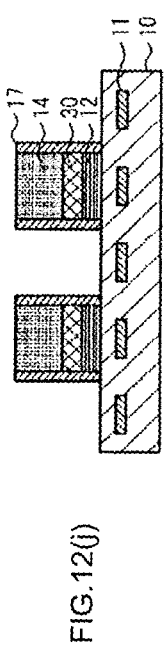

Referring to FIGS. 11 to 12(j), a solid-state imaging device and a method of producing the same according to a fourth embodiment of the present invention will be described.

(4-1) Configuration of Solid-State Imaging Device

The solid-state imaging device according to the fourth embodiment is characterized in that the device includes a semiconductor substrate that is provided thereon with a barrier material layer, similar to the second embodiment, to serve as a source of supplying material of a reaction product that forms barriers. When a first color filter is formed by etching, barriers can be formed by the reaction product of the material of the barrier material layer and the dry etching gas, besides the barriers formed by the reaction product of the first color filter material and the dry etching gas.

The solid-state imaging device according to the fourth embodiment has a planarizing underlayer formed on a semiconductor substrate, and a barrier material layer 30 formed on the planarizing underlayer, and is different from the second embodiment in the layer configuration (lamination order).

As shown in the cross-sectional structure of FIG. 11, the solid-state imaging device of the fourth embodiment of the present invention includes a semiconductor substrate 10 having a plurality of two-dimensionally arranged photoelectric conversion elements 11, and microlenses 18. Further, the solid-state imaging device of the fourth embodiment includes color filters 14, 15 and 16 of respective colors provided between the semiconductor substrate 10 and the microlenses 18, barriers 17 provided between the color filters 14, 15 and 16, a planarizing underlayer 12 provided above the semiconductor substrate 10, and a planarizing overlayer 13 provided over the surfaces of the color filters 14, 15 and 16 and the barriers 17. The solid-state imaging device of the fourth embodiment also includes a barrier material layer 30 provided between the semiconductor substrate 10 and the microlenses 18. The barrier material layer 30 is formed on the planarizing underlayer 12 that is provided on the semiconductor substrate 10.

In the solid-state imaging device of the second embodiment, components similar to those of the solid-state imaging devices of the first, second and third embodiments are given the same reference signs. Specifically, the semiconductor substrate 10 having photoelectric conversion elements 11, the planarizing underlayer 12, the barrier material layer 30, the color filters 14, 15 and 16, the planarizing overlayer 13, and the microlens 18 respectively have configurations similar to those of the solid-state imaging device of the first embodiment. Further, the solid-state imaging device of the fourth embodiment has the same configuration as that of the second embodiment, except that the lamination order of the planarizing underlayer 12 and the barrier material layer 30 is reversed. Thus, detailed description of the components is omitted.

(4-2) Method of Producing Solid-State Imaging Device

Referring to FIGS. 12(a)-12(j), a method of producing the solid-state imaging device of the fourth embodiment of the present invention will be described.

Figure 12A:
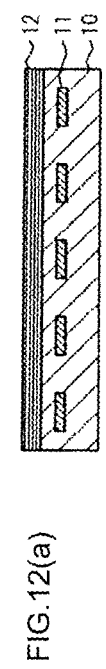
Figure 12B:
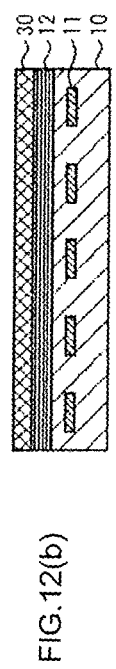
Figure 12C:
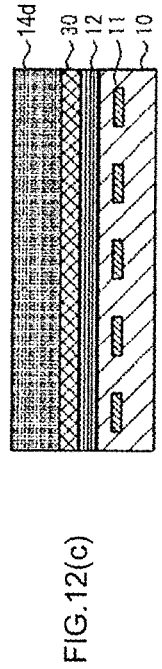
Figure 12D:
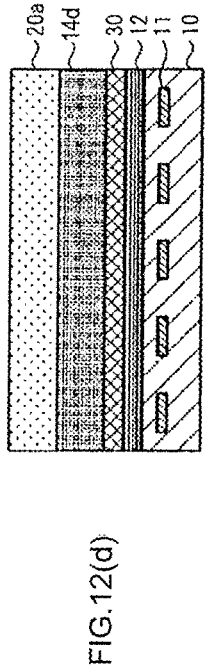
Figure 12E:
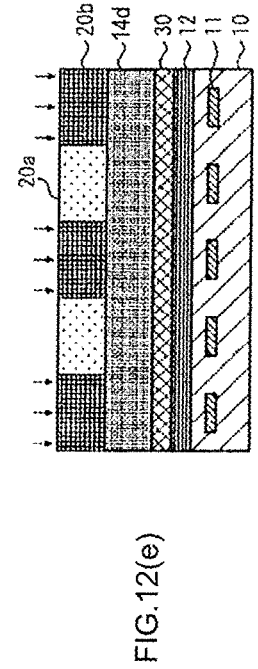

A semiconductor substrate 10 having a plurality of two-dimensionally arranged photoelectric conversion elements 11 as shown in FIG. 12(a) is used for forming the device. On a surface of the substrate, a planarizing underlayer 12 is formed. Subsequently, as shown in FIG. 12(b), a transparent barrier material layer 30 is formed on the surface of the planarizing underlayer 12 so as to have a predetermined thickness. The barrier material layer 30 transmits visible light having a wavelength that is in the range of 380 nm to 700 nm.

Thereafter, as shown in FIGS. 12(c) to 12(j), a first color filter film 14d is formed, followed by forming an etching mask 20 on the surface of the first color filter film 14d to etch the filter film 14d. Then, the etching mask 20 is removed to form a first color filter 14 and barriers 17. In the present embodiment, part of the barrier material layer 30 and the planarizing underlayer 12 remain under the first color filter 14.

The barrier material layer 30, which is transparent to visible light, does not have to be completely removed by etching if there is no variation in the thickness throughout the layer. The planarizing underlayer 12 under the barrier material layer 30 may be removed or may be left unremoved, as long as the absence/presence of the layer 12 does not affect the semiconductor substrate 10 and the photoelectric conversion elements 11. If a resin-based material is used for the planarizing underlayer 12, the etch rate of the planarizing underlayer 12 will be high. Accordingly, if the barrier material layer 30 is completely removed, it is very likely that the planarizing underlayer 12 thereunder is etched in a short time and does not remain.

The second and third color filters 15 and 16, the planarizing overlayer 13, and the microlenses 18 can be formed through processing similar to that of the first embodiment, as shown in FIGS. 5(a) to 5(h).

(Color Filters of Four or More Colors)

Color filters of four or more colors can be formed similarly to the method described in the first embodiment. Specifically, the first color filter 14, under which the planarizing underlayer 12 and the barrier material layer 30 are provided, may be formed first, and then the third and subsequent color filters may be formed by repeating processing similar to one used for forming the second color filter 15. The color filter of the last color may be formed through processing similar to that of the third color filter 16 described above. With this processing, the color filters of four or more colors can be produced.

(Modifications)

As shown in FIG. 11, the first color filter film 14d has been etched until the semiconductor substrate 10 is exposed to form the second and third color filters. However, the embodiment is not limited to such a configuration. For example, the barrier material layer 30 may be etched halfway.

Advantageous Effects

According to the fourth embodiment of the invention, advantageous effects similar to those described in the second embodiment can be obtained.

(9) The refractive index and reflectance of the barriers are easily adjusted by adjusting the composition and the thickness of the barrier material layer which serves as a source of supplying material of a reaction product that forms the barriers on the semiconductor substrate of the solid-state imaging device.

EXAMPLES

A solid-state imaging device and a solid-state imaging device will be specifically described below by way of examples.

Example 1

As described above, in the second to fourth embodiments, a barrier material layer and a planarizing underlayer are formed on a semiconductor substrate which is formed with photoelectric conversion elements. However, in many cases, a surface protective layer is formed on the semiconductor substrate in the photoelectric conversion element forming process. The surface protective layer is made such as of $SiO_2$, SiN or polysilicon. In the present first embodiment, this surface protective layer of the semiconductor substrate is used as a barrier material layer, and thus the barrier material layer is not formed anew on the semiconductor substrate.

A coating liquid containing an acrylate resin was spin-coated onto a semiconductor substrate including two-dimensionally arranged photoelectric conversion elements at a rotation speed of 2,000 rpm, followed by heating and curing the resin at 200° C. for 20 minutes using a hot plate. Thus, a planarizing underlayer was formed on the semiconductor substrate. The planarizing underlayer in this case had a thickness of 50 nm.

Then, a green pigment dispersion not containing a photosensitive material, that is, a first color filter material containing a green pigment of the first color, was spin-coated onto the underlying planarizing layer at a rotation speed of 1000 rpm. The green pigment of the color filter material of the first color used for coating was C.I. PG58. The pigment concentration was 80 wt. % and the layer thickness was 500 nm. As a resin, that is, a main component of a green resist, a thermosetting acrylic resin was used.

Subsequently, the resultant object was baked at 230° C. for 6 minutes to cure the green color filter film.

Then, a positive resist (OFPR-800: manufactured by TOKYO OHKA KOGYO CO., LTD) was spin-coated at a rotation speed of 1,000 rpm using a spin coater, followed by prebaking at 90° C. for 1 minute. With this processing, a sample was prepared with the application of a photoresist, that is, a photosensitive resin mask material layer, with a thickness of 1.5 μm.

This positive resist, that is, the photosensitive resin mask material layer, is soluble in a developer by chemical reaction caused when irradiated with ultraviolet rays.

The sample was subjected to photolithography, for exposure through a photomask. The exposure apparatus used was one that used a light source with a wavelength of i-line (365 nm).

Then, the sample was developed by using 2.38 wt % of TMAH (tetramethylammonium hydroxide) as a developer, to form an etching mask having openings at positions where second and third color filters would be formed. When a positive resist is used, in many cases, the resist is baked in a dehydrating manner after development to cure the photoresist, that is, the photosensitive resin mask material layer. However, this time, the sample was not baked for facilitating removal of the etching mask after dry etching. Thus, the resist was not cured, and thus improvement in etch selectivity was not expected. Therefore, the resist was formed with a thickness of 1.5 μm, which was twice or more the thickness of the first color filter, that is, the green color filter. Each opening pattern in this case was 1.1 μm×1.1 μm.

Then, the sample was dry-etched using the formed etching mask. The dry etching apparatus used in this case was of parallel-plate type. The sample was dry-etched in multiple stages by changing the etching conditions halfway so as not to affect the primer semiconductor substrate.

First, three types of gases $CF_4$, $O_2$ and Ar were mixed to perform etching. Gas flow rates of $CF_4$ and $O_2$ were each set to 5 ml/min and that of Ar was set to 200 ml/min. That is, the gas flow of Ar occupied 95.2% of the total gas flow. The sample was etched in this case at a chamber pressure of 1 Pa and an RF power of 500 W. Under these conditions, 70% of the total thickness 500 nm of the green color filter film, corresponding to about 350 nm, was etched and then, the etching conditions were changed to the following conditions.

Subsequently, three types of gases of $CF_4$, $O_2$ and Ar were mixed to perform etching. Gas flow rates of $CF_4$ and $O_2$ were each set to 25 ml/min and that of Ar was set to 50 ml/min. That is, the gas flow of Ar occupied 50% of the total gas flow. The sample was etched in this case at a chamber pressure of 5 Pa and an RF power of 300 W. Under these conditions, the sample was etched so as to progress the removal of the reaction product adhering to the side surfaces of the photoresist serving as the etching mask. Under these conditions, a film with a thickness of about 450 nm corresponding to 90% of the total thickness 500 nm of the green first color filter film was etched. The etching amount at the second stage was about 100 nm. Since the gas flow rates of $CF_4$ and $O_2$ were increased, the etch rate was about 5 nm/sec, which meant that the etching progressed very fast. Therefore, removal of the reaction product on the sidewalls of the green color filter did not make much progress, but removal of the reaction product adhering to the side surfaces of the upper resist made progress. Change of conditions to these ones halfway exerted an effect of removing the reaction product protruding higher than the green color, after removal of the resist.

Then, the sample was etched using Ar gas singly under the conditions of an Ar gas flow rate of 200 ml/min, a chamber pressure of 1.5 Pa, and an RF power of 400 W. Etching the sample under these conditions, the remnant green color filter material was etched, and simultaneously, the planarizing underlayer was etched. During etching under the conditions of only Ar gas, the physical impact of ions produces the main reaction. Therefore, the residues that remain unetched by the chemical reaction of the green color filter become effectively removable. The physical impacts cause etching of the surface protective layer of the semiconductor substrate which is under the green color filter, so that a reaction product of the surface protective layer and the etching gas adheres to the sidewalls of the green color filter. The surface of the semiconductor substrate used in the present example had been protected by a film of $SiO_2$. Accordingly, the film of $SiO_2$ adheres to the sidewalls of the green color filter by the etching of Ar gas. With the time adjustment of etching conditions, the thickness (width) of the film of $SiO_2$ of the sidewall is controlled. Since these etching conditions also had a purpose of adjusting difference in the in-plane etch rate of the etching sample, the sample was etched so that the overetching amount was 5%. In other words, a film with a thickness of 550 nm corresponding to 110% of the total thickness 500 nm of the green color filter material was etched under the three-stage conditions. The etching under these conditions resulted in etching of $SiO_2$, that is, the surface protective layer of the semiconductor substrate, by about 5 nm. Under these etching conditions, the thickness (width) of each $SiO_2$ barrier, which adhered to the corresponding sidewall of the green color filter from the barrier material layer, was 20 nm. Further, the sidewall protective layer, which was formed by adhesion of the reaction product of the green color filter and the etching gas when the green color filter was etched, had a thickness (width) of 20 nm. Thus, barriers each having a total thickness of 40 nm were formed.

Then, the sample was etched using an $O_2$ gas singly under the conditions of an $O_2$ gas flow rate of 100 ml/min, a chamber pressure of 15 Pa, and an RF power of 150 W. Under these conditions, the layer at the top of the etching mask, whose surface was altered by being damaged, was removed, and at the same time, the residues of the green color filter material, which were not removed by the Ar gas and remained on the bottom, were etched.

Then, the photosensitive resin mask material, which was used as the etching mask, was removed. The method used in this case was a method of using solvent. Specifically, the resist was removed by a peeling liquid (manufactured by TOKYO OHKA KOGYO CO., LTD) using a spray cleaning apparatus. In this case, physical impacts were applied by spraying of the spray cleaning apparatus at the time of cleaning, which exerted an effect of removing the reaction product of the resist adhered to the sidewalls, that is, effect of removing portions of the barriers protruding higher that the green color filter.

In the barrier layer formed as a protective layer on each green color filter sidewall by dry etching based on the manufacturing method, 20 nm thickness was derived from the green color filter and 20 nm thickness was derived from the surface protective layer of the semiconductor substrate, totaling 40 nm. Depending on the dry etching conditions, the thickness of the protective layer serving as each sidewall is controllable in the range of about 0 nm to 200 nm. However, since the pattern size of the solid-state imaging device was about 1.1 μm, thick patterns of the barriers unavoidably block incident light. Also, the surface protective layer of the semiconductor substrate is etched and the photoelectric conversion elements are damaged. Accordingly, the sample was etched with this thickness control range.

(Preparation of Second Color Filter)

Subsequently, a photosensitive second color filter material containing a blue pigment dispersion was applied onto an entire surface of the semiconductor substrate to provide a photosensitive second color filter.

Then, the photosensitive second color filter material was selectively exposed by photolithography.

Then, the photosensitive color filter material was developed to form a blue color filter. In this case, the pigments used for the photosensitive color filter material of the blue resist were C.I. PB156 and C.I. PV23, and the pigment concentration was 40 wt %. The thickness of the blue color filter was 0.6 μm. As the resist, i.e., the main component of the blue resist, a photosensitive acrylic resin was used.

Then, the photosensitive second color filter material serving as the second color filter (blue color filter) was heated in an oven at 230° C. for 30 minutes and firmly cured. After the heating, no peeling, collapse of pattern or the like was observed even after the processing of forming the third color filter or other filters. The second color filter had a periphery covered with the first color filter of good rectangularity and thus was formed with good rectangularity. Therefore, the second color filter was confirmed to be cured with good adhesion between the bottom and the periphery.

(Preparation of Third Color Filter)

Subsequently, a photosensitive third color filter material, that is, a red pigment dispersion resist was applied onto an entire surface of the semiconductor substrate.

Then, the photosensitive third color filter material was selectively exposed with photomask patterns by photolithography.

Then, the photosensitive third color filter material was developed to form a red third color filter.

In this case, the pigments used for the red resist were C.I. PR117, C.I. PR48:1, and C.I. PY139, and the pigment concentration was 45 wt %. The thickness of the third color filter was 0.6 μm.

Then, the red photosensitive third color filter material serving as the third color filter was heated in an oven at 230° C. for 20 minutes and firmly cured. The third color filter had a periphery covered with the first color filter of good rectangularity and thus was formed with good rectangularity. Therefore, the third color filter was confirmed to be cured with good adhesion between the bottom and the periphery.

Then, a coating liquid containing an acrylate resin was spin-coated onto the color filter formed through the above flow, at a rotation speed of 1,000 rpm, followed by heating and curing the resin at 200° C. for 30 minutes using a hot plate, thereby forming a planarizing overlayer.

Finally, the microlenses were formed on the planarizing overlayer by a well-known technique of heat flow method to complete the solid-state imaging device of Example 1.

The thus obtained solid-state imaging device had a thin planarizing underlayer formed on the surface of the semiconductor substrate and had color filters of three colors formed thereon. Since the green color filter of the first color used a thermosetting resin, the pigment concentration was increased in the solid components and the color filter was formed with a small thickness. Thus, the solid-state imaging device had a small distance between the microlenses and the semiconductor substrate thereunder, and exerted satisfactory sensitivity. In addition, a two-layer structure barrier having a Zn-containing pigment layer and $SiO_2$ was formed between color filters of respective colors, which led to reducing color mixing between the color filters.

The color filter material of the first color filter serving as a green color filter is thermally cured, and therefore has an advantage of easily mixing with another resin and the like, unlike in the case of using photosensitive components. For example, a resin having a high refractive index may be used as a main component to form the green color filter (first color filter), thereby setting refractive indexes of the red color filter (second color filter) and the blue color filter (third color filter) to the comparable level. This may bring about an effect of reducing surface reflection and provide a solid-state imaging device having satisfactory sensitivity. In addition, since barriers are formed on the respective sidewalls of each color filter pattern of the green color filter (first color filter), the refractive indexes of three colors of RGB can have a comparable contrast relationship with respect to the barriers, which exerts an effect of preventing color mixing caused by the barrier structure.

Example 2

As Example 2, a solid-state imaging device having a structure described in the second embodiment will be specifically described. The solid-state imaging device shown in Example 2 has a structure in which all the barrier material layer portions under the respective second and subsequent color filters have been removed by etching. Application of the solid-state imaging device shown in Example 2 may depend on the structure of the semiconductor substrate formed with the photoelectric conversion elements. Specifically, for example, the device of Example 2 may be applied to a structure where the thickness of the barrier material layer increases to unavoidably increase the distance from the color filters to the photoelectric conversion elements.

(Formation of Barrier Material Layer)

SOG set to a low viscosity was spin-coated onto a semiconductor substrate including two-dimensionally arranged photoelectric conversion elements at a rotation speed of 5,000 rpm, followed by heating at 250° C. for 30 minutes using a hot plate, thereby forming a barrier material layer formed of a $SiO_2$ thin film with a thickness of 30 nm.

(Formation of Planarizing Underlayer)

A coating liquid containing an acrylate resin was spin-coated onto the barrier material layer at a rotation speed of 3,000 rpm, followed by heating and curing the resin at 200° C. for 20 minutes using a hot plate, thereby forming a planarizing underlayer. The planarizing underlayer in this case had a thickness of 30 nm.

(Formation of First Color Filter and Barriers)

As the color filter material of a first color filter (green color filter), a green pigment dispersion not containing photosensitive material was used. The green pigment dispersion was spin-coated onto the surface of the planarizing underlayer at a rotation speed of 1,000 rpm. As a resin, i.e., a main component of the green pigment dispersion, a thermosetting acrylic resin was used. The green pigment contained in the green pigment dispersion was C.I. PG58, and the green pigment concentration in the green pigment dispersion was 80 wt %. The green color filter material had a coating thickness of 500 nm.

Then, the resultant object was baked at 230° C. for 6 minutes to cure the green color filter material, thereby forming a green color filter film.

Then, a positive resist (OFPR-800: manufactured by TOKYO OHKA KOGYO CO., LTD) was spin-coated onto the surface of the green color filter film at a rotation speed of 1,000 rpm using a spin coater, followed by prebaking at 90° C. for 1 minute. With this processing, a sample was prepared, with the application of a photoresist, that is, a photosensitive resin mask material layer, with a thickness of 1.5 μm.

This positive resist, that is, the photosensitive resin mask material, is soluble in a developer by chemical reaction caused when irradiated with ultraviolet rays.

Then, the sample was subjected to photolithography, for exposure through a photomask. The exposure apparatus used was one that used a light source with a wavelength of i-line (365 nm).

Then, the sample was developed by using 2.38 wt % of TMAH (tetramethylammonium hydroxide) as a developer, to form a photoresist having openings at positions where second and third color filters would be formed. When a positive resist is used, in many cases, the resist is baked in a dehydrating manner after development to cure the photoresist, that is, the photosensitive resin mask material. However, this time, the sample was not baked for facilitating removal of the etching mask after dry etching. Thus, the resist was not cured, and thus improvement in etch selectivity was not expected. Therefore, the photoresist was formed with a thickness of 1.5 μm, which was twice or more the thickness of the first color filter, that is, the green color filter. Each opening in this case had a size of 1.1 μm×1.1 μm.

Then, the sample was dry-etched using the formed photosensitive resin mask material layer as an etching mask. The dry etching apparatus used in this case was of parallel-plate type. The sample was dry-etched in multiple stages so as not to affect the primer semiconductor substrate.

First, three types of gases $CF_4$, $O_2$ and Ar were mixed to perform etching. Gas flow rates of $CF_4$ and $O_2$ were each set to 5 ml/min and that of Ar was set to 200 ml/min. The sample was etched at a chamber pressure of 1 Pa and an RF power of 500 W. Under these conditions, 70% of the total thickness 500 nm of the green color filter film, corresponding to about 350 nm, was etched and then, the etching conditions were changed to the following conditions.

Subsequently, the sample was etched using an etching gas that was a mixture of three types of gases of $CF_4$, $O_2$ and Ar. Gas flow rates of $CF_4$ and $O_2$ in this case were each set to 25 ml/min and that of Ar was set to 50 ml/min. The sample was etched in this case at a chamber pressure of 5 Pa and an RF power of 300 W. Under these conditions, the sample was etched so as to progress the removal of the reaction product adhering to the side surfaces of the photoresist serving as the etching mask. Under these conditions, about 90% of the total thickness 500 nm of the green first color filter film was etched. The etching amount at the second stage was about 100 nm. Since the gas flow rates of $CF_4$ and $O_2$ were increased, the etch rate was about 5 nm/sec, which meant that the etching progressed very quickly. Therefore, removal of the reaction product on the sidewalls of the green color filter did not make much progress, but removal of the reaction product adhering to the side surfaces of the upper resist made progress. Change of conditions to these ones halfway exerted an effect of removing the reaction product protruding higher than the green color, after removal of the resist.

Then, the sample was etched using an Ar gas singly under the conditions of an Ar gas flow rate of 200 ml/min, a chamber pressure of 1.5 Pa, and an RF power of 400 W. Etching the sample under these conditions, the remnant green color filter material was etched, and simultaneously, the planarizing underlayer and the barrier material layer were etched. During etching under the conditions of only Ar gas, the physical impact of ions produces the main reaction. Therefore, the residues that remain unetched by the chemical reaction of the green color filter become effectively removable. The physical impacts cause etching of the $SiO_2$ material, that is, the barrier material layer under the green color filter, so that a film of $SiO_2$ adheres to the sidewalls of the green color filter. With the time adjustment of etching conditions, the thickness (width) of the film of $SiO_2$ of the sidewall is controlled. Since these etching conditions also had a purpose of adjusting difference in the in-plane etch rate of the etching sample, the sample was etched so that the overetching amount was 30%. In other words, a film with a thickness of 650 nm corresponding to 130% of the total thickness 500 nm of the green color filter material was etched under the three-stage conditions. When the sample was etched under these etching conditions, the barrier material layer was etched by about 30 nm.

Under these etching conditions, each $SiO_2$ barrier which adhered to the corresponding sidewall of the green color filter from the barrier material layer, had a thickness (width) of 30 nm. Further, the sidewall protective layer, which was formed by adhesion of the reaction product of the green color filter and the etching gas when the green color filter was etched, had a thickness (width) of 20 nm. Thus, barriers each having a total thickness of 50 nm were formed.

Then, the sample was etched using an $O_2$ gas singly under the conditions of an $O_2$ gas flow rate of 100 ml/min, a chamber pressure of 15 Pa, and an RF power of 150 W. Under these conditions, the layer at the top of the etching mask, whose surface was altered by being damaged, was removed, and at the same time, the residues of the green color filter film, which were not removed by the Ar gas and remained on the bottom, were etched.

Then, the photosensitive resin mask material, which was used as the etching mask, was removed. The method used in this case was a method of using solvent. Specifically, the resist was removed by a peeling liquid 104 (manufactured by TOKYO OHKA KOGYO CO., LTD) using a spray cleaning apparatus. In this case, physical impacts were applied by spraying of the spray cleaning apparatus at the time of cleaning, which exerted an effect of removing the reaction product of the resist adhered to the sidewalls, that is, effect of removing portions of the barriers protruding higher that the green color filter.

In the barrier layer formed as a protective layer on each green color filter sidewall by dry etching, 20 nm thickness was derived from the green color filter and 30 nm thickness was derived from the barrier material layer, totaling 50 nm. Depending on the thickness of the underlying barrier material layer and the dry etching conditions, the thickness of the protective layer adhering to the sidewalls is controllable in the range of 0 nm to about 200 nm. However, since the pattern size of the solid-state imaging device is about 1.1 if patterns of the barriers are made thick, the barriers unavoidably block incident light. Further, if the thickness of the barrier material layer is made large, the distance from the color filter to the photoelectric conversion elements increases. Accordingly, in Example 2, the thickness of the barrier material layer was set to about 30 nm, and the thickness (width) of each barrier was controlled to 50 nm. Also, the etching time was adjusted almost to the time taken for removing all the barrier material layer by etching. Otherwise, the surface of the semiconductor substrate would be etched by further progress of the etching.

(Preparation of Second and Third Color Filters, and Others.)

Thereafter, in Example 2, a method similar to Example 1 was used to form second and third color filters, a planarizing overlayer, and microlenses, to thereby form a solid-state imaging device of Example 2.

Example 3

In Example 3, a solid-state imaging device having the structure described in the third embodiment will be specifically described. The solid-state imaging device shown in Example 3 has a structure in which all the barrier material layer portions under the respective second and subsequent color filters have been permitted to remain unetched. In Example 3, the barrier material layer portions permitted to remain unetched at the time of etching exert an effect of protecting the underlying semiconductor substrate from being etched. Further, by increasing the thickness of the barrier material layer, the thickness of each barrier is controlled to be thick. However, the thickness of the barrier material layer needs to be adjusted according to the structure and characteristics of the semiconductor substrate and the photoelectric conversion elements. Otherwise, the increase in the thickness of the barrier material layer would increase the distance from the color filters to the photoelectric conversion element becomes.

(Formation of Barrier Material Layer)

SOG set to a low viscosity was spin-coated onto a semiconductor substrate including two-dimensionally arranged photoelectric conversion elements at a rotation speed of 4,000 rpm, followed by heating at 250° C. for 30 minutes using a hot plate, thereby forming a barrier material layer formed of a $SiO_2$ thin film with a thickness of 50 nm.

(Formation of Planarizing Underlayer)

A coating liquid containing an acrylate resin was spin-coated onto the barrier material layer at a rotation speed of 4,000 rpm, followed by heating and curing the resin at 200° C. for 20 minutes using a hot plate, thereby forming a planarizing underlayer. The planarizing underlayer in this case had a thickness of 20 nm.

(Formation of first Color filter)

With the method shown in Example 2, the first color filter film (green color filter film) was formed. Then, a photosensitive resin mask material was patterned to form an etching mask.

Subsequently, the barrier material layer was etched halfway. First, three types of gases $CF_4$, $O_2$ and Ar were mixed to perform etching. Gas flow rates of $CF_4$ and $O_2$ were each set to 5 ml/min and that of Ar was set to 200 ml/min. The sample was etched at a chamber pressure of 1 Pa and an RF power of 500 W. Under these conditions, 70% of the total thickness 500 nm of the green color filter film, corresponding to about 350 nm, was etched and then, the etching conditions were changed to the following conditions.

Subsequently, the sample was etched using an etching gas that was a mixture of three types of gases of $CF_4$, $O_2$ and Ar. Gas flow rates of $CF_4$ and $O_2$ in this case were each set to 25 ml/min and that of Ar was set to 50 ml/min. The sample was etched in this case at a chamber pressure of 5 Pa and an RF power of 300 W. Under these conditions, the sample was etched so as to progress the removal of the reaction product adhering to the side surfaces of the photoresist serving as the etching mask. Under these conditions, about 90% of the total thickness 500 nm, corresponding to about 450 nm, of the first color filter film (green first color filter film) was etched. The etching amount at the second stage was about 100 nm. Since the gas flow rates of $CF_4$ and $O_2$ were increased, the etch rate was about 5 nm/sec, which meant that the etching progressed very quickly. Therefore, removal of the reaction product on the sidewalls of the green color filter did not make much progress, but removal of the reaction product adhering to the side surfaces of the upper resist made progress. Change of conditions to these ones halfway exerted an effect of removing the reaction product protruding higher than the green color, after removal of the resist.

Then, the sample was etched using an Ar gas singly under the conditions of an Ar gas flow rate of 200 ml/min, a chamber pressure of 1.5 Pa, and an RF power of 400 W. Etching the sample under these conditions, the remnant green color filter material was etched, and simultaneously, the planarizing underlayer and the barrier material layer were etched. During etching under the conditions of only Ar gas, the physical impact of ions produces the main reaction. Therefore, the residues that remain unetched by the chemical reaction of the green color filter become effectively removable. The physical impacts cause etching of the $SiO_2$ material, that is, the barrier material layer under the green color filter, so that a film of $SiO_2$ adheres to the sidewalls of the green color filter. With the time adjustment of etching conditions, the thickness (width) of the film of $SiO_2$ of the sidewall is controlled.

Since these etching conditions also had a purpose of adjusting difference in the in-plane etch rate of the etching sample, the sample was etched so that the overetching amount was 30%. In other words, a film with a thickness of 650 nm corresponding to 130% of the total thickness 500 nm of the green color filter material was etched under the three-stage conditions. When the sample was etched under these etching conditions, the barrier material layer was etched by about 30 nm.

Under these etching conditions, each $SiO_2$ barrier which adhered to the corresponding sidewall of the green color filter from the barrier material layer, had a thickness (width) of 30 nm. Further, the sidewall protective layer, which was formed by adhesion of the reaction product of the green color filter and the etching gas when the green color filter was etched, had a thickness (width) of 20 nm. Thus, barriers each having a total thickness of 50 nm were formed.

Then, the sample was etched using an $O_2$ gas singly under the conditions of an $O_2$ gas flow rate of 100 ml/min, a chamber pressure of 15 Pa, and an RF power of 150 W. Under these conditions, the layer at the top of the etching mask, whose surface was altered by being damaged, was removed, and at the same time, the residues of the green color filter film, which were not removed by the Ar gas and remained on the bottom, were etched.

With the etching conditions set forth above, 30 nm of the total thickness 50 nm of the barrier material layer was removed by etching. Accordingly, 20 nm of the barrier material layer and 20 nm of the planarizing underlayer remain under the second and subsequent color filters. Under these conditions, the second and subsequent color filters can be formed with a thickness larger by about 40 nm than the first color filter. When forming the second and subsequent color filters by lithography, it is difficult to increase the pigment concentration, unlike the first color filter that is cured by heating. Therefore, using this thickness adjustment of the barrier material layer and the planarizing underlayer, the color of each color filter can be adjusted.

(Preparation of Second and Third Color Filters, and Others.)

Thereafter, in Example 2, a method similar to Example 1 was used to form second and third color filters, a planarizing overlayer, and microlenses, to thereby form a solid-state imaging device of Example 3.

Example 4

In Example 4, a solid-state imaging device having the structure described in the fourth embodiment will be specifically described. A solid-state imaging device of Example 4 has a configuration obtained by reversing steps of forming a barrier material layer and a planarizing underlayer from those for the solid-state imaging device of Example 2. In Example 4, the above forming steps can sufficiently planarize the semiconductor substrate before forming the barrier material layer. Accordingly, the barrier material layer can have a uniform thickness on overall surface of the semiconductor substrate. Accordingly, the barriers will have a uniform thickness, or the distance from the color filter to the photoelectric conversion elements will be constant. Further, as long as the barrier material layer is not completely removed by etching, the planarizing underlayer remains as it is, improving adhesion of the second and subsequent color filters and adjusting the thickness of each color.

(Formation of Planarizing Underlayer)

A coating liquid containing an acrylate resin was spin-coated onto a semiconductor substrate including two-dimensionally arranged photoelectric conversion elements at a rotation speed of 2,000 rpm, followed by heating and curing the resin at 200° C. for 20 minutes using a hot plate. The planarizing underlayer in this case had a thickness of 50 nm.

(Formation of Barrier Material Layer)

SOG set to a low viscosity was spin-coated onto a planarizing underlayer at a rotation speed of 5,000 rpm, followed by heating at 250° C. for 30 minutes using a hot plate, thereby forming a barrier material layer formed of a $SiO_2$ thin film with a thickness of 30 nm.

(Preparation of First, Second and Third Color Filters)

Thereafter, in Example 4, a method similar to Example 1 was used to form second and third color filters, a planarizing overlayer, and microlenses, to thereby form a solid-state imaging device of Example 4.

Under these etching conditions, each $SiO_2$ barrier which adhered to the corresponding sidewall of the green color filter from the barrier material layer, had a thickness (width) of 30 nm. Further, the sidewall protective layer, which was formed by adhesion of the reaction product of the green color filter and the etching gas when the green color filter was etched, had a thickness (width) of 20 nm. Thus, barriers each having a total thickness of 50 nm were formed.

(Evaluations)

In the examples described above, barriers with a thickness in the range of 40 nm to 50 nm were formed between color filter patterns of respective colors.

The intensities of red, green, and blue signals of the solid-state imaging device of each example described above were evaluated with respect to the intensities of red, green, and blue signals of the solid-state imaging device including no barriers between the color filter patterns of respective colors.

Table 1 below indicates evaluations of signal intensities of individual colors.

ing devices of Examples 1 to 4 each provided with barriers between the color filter patterns of respective colors. Also, when the evaluations of the solid-state imaging device of Example 1 including no barrier material layer are compared with those of the solid-state imaging devices of Examples 2 to 4 each including a barrier material layer, the signal intensities of respective colors were improved in the latter.

It will be understood from the above that, in each solid-state imaging device provided with barriers between the color filter patterns of respective colors, the signal intensities of respective colors were improved and color mixing was reduced, comparing with the solid-state imaging device not provided with the barrier. This is considered to be because, when incident light from an oblique direction of the pixel passes through a color filter and travels toward another color filter pattern, the incident light is blocked by the barriers or the light path is changed due to the barriers. Accordingly, it is considered that the light traveling toward another color filter pattern has been prevented from entering another photoelectric conversion element, and color mixing has been resultantly reduced.

In the examples set forth above, detection of blue light was confirmed to increase by about 4%, comparing with the solid-state imaging device produced by increasing gas flow rates of a fluorocarbon- or oxygen-based gas so as not to form barriers during etching, while adjusting the etching pressure.

On the other hand, red light intensity partially decreased, comparing with the evaluations of the existing solid-state imaging device not provided with the barrier. However, this is considered to be due to the influence of color mixing caused in the existing solid-state imaging device without barriers, when light passing through the blue and green color filters has entered the photoelectric conversion element under the red color filter, by the influence of the refractive index of the color filters. Accordingly, the performance of the existing solid-state imaging device appears to have improved, and the signal intensities of Examples 1 and 4 appear to have relatively decreased.

In the examples, the solid-state imaging device of Example 2 showed the best results. This is considered to be due to the short distance between the color filters and the photoelectric conversion elements.

From the above, the effect of forming barriers between the color filter patterns of respective colors was confirmed in each example.

The barriers of the above examples were formed of the reaction product resulting from the etching of the green first color filter film. The first color filter material mixed with the green pigment of the above examples contain zinc. Further, the reaction product of the first color filter material and the etching gas, which adhered to the sidewalls of the green color filter, is unlikely to be removed at the time of etching.

TABLE 1

|  | Barrier material layer thickness (nm) | Planarizing underlayer thickness (nm) | Pigment-derived barrier thickness (nm) | Barrier material layer-derived barrier thickness (nm) | Red signal intensity increase (%) | Green signal intensity increase (%) | Blue signal intensity increase (%) |
| --- | --- | --- | --- | --- | --- | --- | --- |
| Example 1 | 0 | 50 | 20 | 20 | -0.3 | 1.5 | 2.1 |
| Example 2 | 30 | 30 | 20 | 30 | 1.2 | 2.1 | 4.5 |
| Example 3 | 50 | 20 | 20 | 30 | 1.1 | 1.9 | 4.3 |
| Example 4 | 30 | 50 | 20 | 30 | -0.1 | 1.6 | 3.1 |

As will be understood from Table 1, signal intensities of respective colors generally increased in the solid-state imag- Accordingly, the barriers contain plenty of zinc metal. Therefore, it is considered that even with the thickness of 50 nm, the film is ensured to contain plenty of metal, exhibiting a strong light-blocking effect.

In the present examples, the microlenses were formed by a heat flow method. However, the microlenses may more preferably be formed by patterning based on dry etching which makes the microlenses thinner at the lower parts.

In the present examples, a thermosetting acrylic resin was used as a main resin component of the green pigment dispersion of the first color filter material that served as a first color. However, similarly to the red and blue pigment dispersions for the second and subsequent photosensitive color filter materials, a resin for a photosensitive color filter material, that is, a photocuring (radiation curing) acrylic resin can also be used. In this case, it is preferred to reduce the amount of monomer or photopolymerization initiator that are needed to reduce the thickness of the first color filter film.

In this case, the photosensitive first color filter material serving as the first color is a resin material unsuitable for the exposure and development of high-definition patterns. In contrast, in an embodiment of the present invention, a first color filter material as a first color is applied to an overall surface of the semiconductor substrate, and then the overall surface is exposed to cure the color filter material and form an etching mask, followed by etching. Thus, selective exposure/development is not done only based on the photolithography technique of conventional art. Accordingly, the amount of photosensitive resin contained only needs to be sufficient to enable curing which is sufficiently resistant to coating, development, and peeling of the photosensitive resin mask material at the time of forming the etching mask. Therefore, the color filter material of each of the present embodiments has an advantageous effect of not needing to contain a photosensitive resin at an amount enabling formation of high-definition patterns by photolithography.

The present application addresses the following. When dry etching is applied, a reaction product is generated as a result of a reaction between an etching gas and a material to be etched. The reaction product may be deposited on the sidewalls of the color filter or in the openings formed by dry etching, and may remain as residues. Thus, dry etching control may become difficult. Further, the color filter material, which is a material to be etched, contains an organic material as a main component, and it is difficult to obtain good etch selectivity between the color filter material and the photosensitive resin material that is an organic material to be used for an etching mask. This makes it difficult to remove the photosensitive resin material altered after etching. In addition, when a layer serving as a color filter is partially removed by dry etching, the primer planarizing layer or the device layer may be damaged. For example, PTL 3 proposes a technique of providing an etching stopper layer to solve this problem. However, the technique of PTL 3 may increase the number of production processes, reduce light permeability, and increase the distance between the aforementioned devices (distance from the color filter patterns to the photoelectric conversion elements).

In addition, the method of using dry etching for solving these problems may bring about difficulty in controlling the process or eliminating the reaction product resulting from dry etching, damage to the underlayer semiconductor substrate of the color filter, and the like. Thus, the measures against the problems bring about another problem of making the processes difficult.

The present invention has an aspect to provide a method of producing a high-definition solid-state imaging device of reducing color mixing, the solid-state imaging device, a method of producing a color filter, and the color filter.

A method of producing a solid-state imaging device according to an aspect of the present invention is characterized in that the method includes: a first color filter film forming step of applying a first color filter material onto a surface of a semiconductor substrate in which a plurality of photoelectric conversion elements are two-dimensionally arranged, the first color filter material including a first resin dispersion obtained by dispersing a first pigment with a resin material as a main component, curing the first color filter material, and forming a first color filter film serving as a precursor of a first color filter containing the first pigment; an opening forming step of applying a photosensitive resin mask material onto a surface of the first color filter film to form a photosensitive resin mask material layer, and forming openings by photolithography in portions of the photosensitive resin mask material layer, facing respective formation positions of second and subsequent color filters containing pigments of colors different from the first pigment; a first color filter forming step of removing portions of the first color filter film exposed from the openings by dry etching using a dry etching gas and using, as an etching mask, the photosensitive resin mask material layer in which the openings are formed, to form the first color filter, and removing the etching mask; a barrier forming step of forming, as barriers provided between color filters of a plurality of colors, a reaction product of the first color filter material and the dry etching gas, the reaction product being formed when the first color filter film is dry-etched in the first color filter forming-step; a second and subsequent color filters forming step of forming second and subsequent color filters containing pigments of colors different from the first color filter; and a microlens forming step of forming a plurality of microlenses for collecting incident light to the respective photoelectric conversion elements.

A solid-state imaging device according to an aspect of the present invention is characterized in that the device includes: a semiconductor substrate having a plurality of two-dimensionally arranged photoelectric conversion elements; a plurality of microlenses arranged above the semiconductor substrate and collecting incident light to the photoelectric conversion elements; color filters of respective colors provided between the semiconductor substrate and the microlenses and arranged according to a preset rule so as to correspond to the respective photoelectric conversion elements; and barriers each provided between the color filters of respective colors. In the device, each of the barriers provided at a sidewall of a first color filter that is a color filter of one color among the color filters of respective colors includes a first wall portion containing a reaction product of a first color filter material contained in the first color filter and a dry etching gas.

A method of producing a color filter according to an aspect of the present invention is characterized in that the method includes: a first color filter film forming step of applying a first color filter material onto a surface of a semiconductor substrate in which a plurality of photoelectric conversion elements are two-dimensionally arranged, the first color filter material including a first resin dispersion obtained by dispersing a first pigment with a resin material as a main component, curing the first color filter material, and forming a first color filter film serving as a precursor of a first color filter containing the first pigment; an opening forming step of applying a photosensitive resin mask material onto a surface of the first color filter film to form a photosensitive resin mask material layer, and forming openings by photolithography in portions of the photosensitive resin mask material layer, facing respective formation positions of second and subsequent color filters containing pigments of colors different from the first pigment; a first color filter forming step of removing portions of the first color filter film exposed from the openings by dry etching using a dry etching gas and using, as an etching mask, the photosensitive resin mask material layer in which the openings are formed, to form the first color filter, and removing the etching mask; a barrier forming step of forming, as barriers provided between color filters of a plurality of colors, a reaction product of the first color filter material and the dry etching gas, the reaction product being formed when the first color filter film is dry-etched in the first color filter forming-step; and a second and subsequent color filters forming step of forming second and subsequent color filters containing pigments of colors different from the first color filter.

A color filter according to an aspect of the present invention is characterized in that the color filter includes: a plurality of color filters arranged planarly and having colors different from each other; and barriers provided on respective sidewalls of a first color filter having a largest area among the plurality of color filters and containing a reaction product of a first color filter material contained in the first color filter and a dry etching gas.

According to the aspects of the present invention, there are provided a method of producing a high-definition solid-state imaging device having reduced color mixing, the solid-state imaging device, a method of producing a color filter and the color filter.

The present invention has so far been described based on the aforementioned embodiments. The present invention should not be construed as being limited to the embodiments illustrated and described herein but should encompass any embodiment which exerts advantageous effects equivalent to ones that the present invention aims at. Further, the present invention should not be construed as being limited to combinations of features of the invention defined by the claims but should be defined by every desired combination of specific features among all the features as disclosed.

REFERENCE SIGNS LIST

10 . . . Semiconductor substrate
11 . . . Photoelectric conversion element
12 . . . planarizing underlayer
13 . . . planarizing overlayer
14 . . . First color filter
14b . . . First color filter pattern
14c . . . Bridge
14d . . . First color filter film
15 . . . Second color filter
15b . . . Second color filter pattern
15d . . . Second color filter film
16 . . . Third color filter
16b . . . Third color filter pattern
16d . . . Third color filter film
17, 27 . . . Barrier
27a . . . First wall portion
27b . . . Second wall portion
18 . . . Microlens
20 . . . Etching mask
20a . . . Photosensitive resin mask layer
20b . . . Pattern
20c . . . Opening
30, 40 . . . Barrier material layer Obviously, numerous modifications and variations of the present invention are possible in light of the above teachings. It is therefore to be understood that within the scope of the appended claims, the invention may be practiced otherwise than as specifically described herein.

What is claimed is:

1. A method of producing a solid-state imaging device, comprising:
   applying, on a semiconductor substrate, a first color filter material comprising a first pigment and a resin material;
   curing the first color filter material such that a first color filter film is formed on the semiconductor substrate;
   forming a photosensitive resin mask material layer on the first color filter film;
   forming a plurality of openings by photolithography in the photosensitive resin mask material layer such that portions of the first color filter film are exposed by the openings;
   dry-etching the portions of the first color filter film by using a dry etching gas and the photosensitive resin mask material layer as an etching mask such that a first color filter having a plurality of openings is formed on the semiconductor substrate;
   removing the etching mask from the first color filter formed on the semiconductor substrate;
   forming, in a group of the plurality of openings, a second color filter comprising a second pigment that is different from the first pigment;
   forming, in another group of the plurality of openings, a third color filter comprising a third pigment that is different from the first and second pigments; and
   forming a plurality of microlenses on the first, second and third color filters such that the plurality of microlenses collects incident light to a plurality of photoelectric conversion elements that are two-dimensionally arrayed in the semiconductor substrate,
   wherein the dry-etching comprises controlling a reaction of the first color filter material with the dry etching gas such that the reaction produces a reaction product of the first color filter material reacted with the dry etching gas and that the reaction product forms a barrier layer formed on side walls of the first color filter in the plurality of openings in the first color filter and having a pattern surrounding the first color filter.

2. The method of claim 1, wherein the dry etching gas includes 90% or more of a noble gas with respect to a total gas flow and further includes at least one reactive gas selected from the group consisting of fluorine, oxygen, and chlorine.

3. The method of claim 1, wherein the dry-etching is conducted in a dry etching chamber at a pressure in a range of from 0.01 Pa to 8.0 Pa.

4. The method of claim 1, wherein the first color filter material includes the first pigment at 70 mass % or more and includes no photosensitive component.

5. The method of claim 1, wherein the resin material of the first color filter material has resistance to an organic solvent used in the removing of the etching mask.

6. The method of claim 1, wherein the forming of the second color filter includes applying, to the semiconductor substrate having the first color filter, a second color filter material comprising the second pigment such that a second color filter film is formed on the semiconductor substrate, exposing, using a photomask, portions of the second color filter material where the second color filter is to be formed, developing unexposed portions of the second color filter material, and photocuring exposed portions of the second color filter film such that the second color filter is formed.

7. The method of claim 1, wherein the dry-etching comprises controlling the reaction of the first color filter material with the etching gas such that an amount of the reaction material on the sidewalls of the first color filter is increased.

8. The method of claim 1, wherein the dry-etching comprises controlling a flow rate of the etching gas such that the reaction of the first color filter material with the etching gas is controlled.

9. The method of claim 1, wherein the dry-etching comprises controlling at least one of a flow rate of the etching gas and a pressure in a dry etching chamber such that the reaction of the first color filter material with the etching gas is controlled to form the barrier layer in the pattern.

10. The method of claim 1, wherein the dry-etching comprises controlling at least one of a flow rate of the etching gas and a pressure in a dry etching chamber such that the reaction of the first color filter material with the etching gas is controlled to form the barrier layer having a thickness of 200 nm or less.

11. The method of claim 1, wherein the dry etching gas includes 90% or more of a noble gas with respect to a total gas flow and further includes at least one reactive gas selected from the group consisting of fluorine, oxygen, and chlorine, and the dry-etching comprises controlling at least one of a flow rate of the etching gas and a pressure in a dry etching chamber in a range of from 0.01 Pa to 8.0 Pa such that the reaction of the first color filter material with the etching gas is controlled to form the barrier layer in the pattern.

12. A method of producing a color filter, comprising:
applying, on a semiconductor substrate, a first color filter material comprising a first pigment and a resin material;
curing the first color filter material such that a first color filter film is formed on the semiconductor substrate;
forming a photosensitive resin mask material layer on the first color filter film;
forming a plurality of openings by photolithography in the photosensitive resin mask material layer such that portions of the first color filter film are exposed by the openings;
dry-etching the portions of the first color filter film by using a dry etching gas and the photosensitive resin mask material layer as an etching mask such that a first color filter having a plurality of openings is formed on the semiconductor substrate;
removing the etching mask from the first color filter formed on the semiconductor substrate;
forming, in a group of the plurality of openings, a second color filter comprising a second pigment that is different from the first pigment;
forming, in another group of the plurality of openings, a third color filter comprising a third pigment that is different from the first and second pigments,
wherein the dry-etching comprises controlling a reaction of the first color filter material with the dry etching gas such that the reaction produces a reaction product of the first color filter material reacted with the dry etching gas and that the reaction product forms a barrier layer formed on side walls of the first color filter in the plurality of openings in the first color filter and having a pattern surrounding the first color filter.

* * * * *